US012119741B2

(12) United States Patent
Xiao et al.

(10) Patent No.: US 12,119,741 B2
(45) Date of Patent: Oct. 15, 2024

(54) MODULAR MULTILEVEL CONVERTER SYSTEM AND VOLTAGE DETECTION METHOD AND OPEN-CIRCUIT FAULT DIAGNOSIS METHOD THEREOF

(71) Applicant: Delta Electronics (Shanghai) Co., Ltd., Shanghai (CN)

(72) Inventors: Peng Xiao, Shanghai (CN); Ming Wang, Shanghai (CN); Yi Zhang, Shanghai (CN); Teng Liu, Shanghai (CN); Jianping Ying, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 682 days.

(21) Appl. No.: 17/232,110

(22) Filed: Apr. 15, 2021

(65) Prior Publication Data

US 2021/0384816 A1 Dec. 9, 2021

(30) Foreign Application Priority Data

Jun. 3, 2020 (CN) .......................... 202010495829.9

(51) Int. Cl.
*H02M 1/32* (2007.01)
*G01R 31/30* (2006.01)
*H02M 7/483* (2007.01)

(52) U.S. Cl.
CPC .......... *H02M 1/32* (2013.01); *G01R 31/3004* (2013.01); *H02M 7/483* (2013.01)

(58) Field of Classification Search
CPC .. H02M 7/483; H02M 1/0009; G05B 19/4183
See application file for complete search history.

(56) References Cited

U.S. PATENT DOCUMENTS

| | | | | |
|---|---|---|---|---|
| 10,177,682 B2* | 1/2019 | Mondal | .................. | H02M 7/48 |
| 11,201,563 B2* | 12/2021 | Slepchenkov | .......... | H02M 7/49 |
| 2015/0008748 A1* | 1/2015 | Deboy | .............. | H02M 7/53871 |
| | | | | 307/77 |
| 2015/0124489 A1* | 5/2015 | Dai | ........................ | H02M 3/335 |
| | | | | 363/17 |
| 2017/0012542 A1* | 1/2017 | Nishijima | ......... | H02M 3/33523 |

FOREIGN PATENT DOCUMENTS

| | | |
|---|---|---|
| CN | 107703433 A | 2/2018 |
| CN | 105675957 B | 7/2018 |
| CN | 110187209 A | 8/2019 |

* cited by examiner

*Primary Examiner* — Jermele M Hollington
*Assistant Examiner* — Temilade S Rhodes-Vivour
(74) *Attorney, Agent, or Firm* — CKC & Partners Co., LLC

(57) ABSTRACT

A modular multilevel converter system, and a voltage detection method and an open-circuit fault diagnosis method thereof are disclosed. The modular multilevel converter system includes: N sub-modules sequentially cascaded, where N is an integer greater than or equal to 2, each of the sub-modules comprising at least one bridge arm and a capacitor connected in parallel to the bridge arm, the capacitor having a positive terminal and a negative terminal; and a voltage detection unit for detecting a voltage between at least two adjacent sub-modules in the N sub-modules, the voltage detection unit being connected between the positive terminal of the capacitor of the first sub-module and the negative terminal of the capacitor of the last sub-module in the at least two sub-modules.

21 Claims, 29 Drawing Sheets

40 configuring N sub-modules sequentially cascaded, where N is an integer greater than or equal to 2, each of the sub-modules comprising at least one bridge arm and a capacitor connected in parallel to the bridge arm, the capacitor having a positive terminal and a negative terminal ⟶ S41 configuring a voltage detection unit for detecting a voltage between at least two adjacent sub-modules in the N sub-modules, and connected between the positive terminal of the capacitor of the first sub-module and the negative terminal of the capacitor of the last sub-module in the at least two sub-modules ⟶ S42

MODULAR MULTILEVEL CONVERTER SYSTEM AND VOLTAGE DETECTION METHOD AND OPEN-CIRCUIT FAULT DIAGNOSIS METHOD THEREOF

CROSS-REFERENCE TO RELATED APPLICATIONS

This non-provisional application claims priority under 35 U.S.C. § 119(a) on Patent Application No. 202010495829.9 filed in P.R. China on Jun. 3, 2020, the entire contents of which are hereby incorporated by reference.

Some references, if any, which may include patents, patent applications, and various publications, may be cited and discussed in the description of this invention. The citation and/or discussion of such references, if any, is provided merely to clarify the description of the present invention and is not an admission that any such reference is "prior art" to the invention described herein. All references listed, cited, and/or discussed in this specification are incorporated herein by reference in their entireties and to the same extent as if each reference was individually incorporated by reference.

BACKGROUND OF THE INVENTION

1. Field of the Invention

The invention relates to the technical field of direct current power transmission and distribution, and particularly to a modular multilevel converter (MMC) system, and a voltage detection method and an open-circuit fault diagnosis method thereof.

2. Related Art

With the development of high-voltage direct-current power transmission, Modular Multilevel Converters (MMCs) are widely used because of their various advantages. However, the use of many sub-modules and switches increases the probability of faults occurred in switches and detection circuits of capacitor voltages of the sub-modules. Therefore, researches on voltage detection of the sub-modules and fault diagnosis of the switches of the MMC are significant for improving the reliability of the converter and promoting applications on occasions such as direct current power transmission, and motor driving.

A module cascade structure of the MMC includes a large number of cascaded sub-modules. However, switches of the cascaded sub-modules are components with a high fault rate, and the fault may be divided into a short-circuit fault and an open-circuit fault. Since the short-circuit fault often represents a relatively large current change, the short-circuit fault can be diagnosed through conventional over-voltage, over-current, and short-circuit protection of the system. However, features of the open-circuit fault are not obvious and are diversified, it is much more difficult to diagnose.

The conventional voltage detection method of the sub-modules usually detects the voltage of each sub-module respectively, and the open-circuit fault is mainly judged based on the detected voltage of each sub-module. However, in the method, each sub-module needs to be provided with a voltage detection circuit, which results in a complex system, high cost, and many potential fault points.

Some other voltage detection methods usually detect voltages of a plurality of sub-modules with a sensor at an output port. However, the method has a bypass state which cannot measure effective voltage. And the methods can only realize fault location at a module level, while cannot determine which switch in the module is breakdown.

In addition, some open-circuit fault diagnosis methods are mainly to detect a voltage of bridge arm of the MMC by a voltage sensor to diagnose faults. However, these methods still cannot determine which switch in the module is breakdown, and it is difficult to select the voltage sensor because an insulation level of the bus voltage has to be taken into consideration.

In conclusion, the voltage detection circuit of the sub-modules and the open-circuit fault diagnosis method of the switches of the conventional MMC have the following problems: too many detection links, high cost, low reliability, and the possible non-detection zone which makes it impossible to realize fault diagnosis at the switch level.

SUMMARY OF THE INVENTION

An object of the invention is to provide a modular multilevel converter system, and a voltage detection method and an open-circuit fault diagnosis method thereof, which can solve one or more problems in the prior art.

To realize the above object, the invention provides a modular multilevel converter system, comprising: N sub-modules sequentially cascaded, where N is an integer greater than or equal to 2, each of the sub-modules comprising at least one bridge arm and a capacitor connected in parallel to the bridge arm, the capacitor having a positive terminal and a negative terminal; and a voltage detection unit for detecting a voltage between at least two adjacent sub-modules in the N sub-modules, the voltage detection unit being connected between the positive terminal of the capacitor of the first sub-module and the negative terminal of the capacitor of the last sub-module in the at least two sub-modules.

The invention further provides a voltage detection method of a modular multilevel converter system, comprising: configuring N sub-modules sequentially cascaded, where N is an integer greater than or equal to 2, each of the sub-modules comprising at least one bridge arm and a capacitor connected in parallel to the bridge arm, the capacitor having a positive terminal and a negative terminal; and configuring a voltage detection unit for detecting a voltage between at least two adjacent sub-modules in the N sub-modules, and connected between the positive terminal of the capacitor of the first sub-module and the negative terminal of the capacitor of the last sub-module in the at least two sub-modules.

The invention further provides an open-circuit fault diagnosis method of a modular multilevel converter system, wherein the modular multilevel converter system comprises a plurality of sub-modules sequentially cascaded, each of the sub-modules comprising at least one bridge arm and a capacitor connected in parallel to the bridge arm, the capacitor having a positive terminal and a negative terminal, and a voltage detection unit for detecting a voltage between first sub-module and a second sub-module connected adjacent in the plurality of sub-modules, the voltage detection unit being connected between the positive terminal of the capacitor of the first sub-module and the negative terminal of the capacitor of the second sub-module in the two sub-modules, wherein the open-circuit fault diagnosis method comprises: detecting voltages of the two sub-modules in a switch-on state and in a switch-off state by the voltage detection unit; determining the sub-module with an open-circuit fault in the two sub-modules according to the detected capacitor voltages.

The additional aspects and advantages of the invention are partially explained in the below description, and partially becoming apparent from the description, or can be obtained through the practice of the invention.

BRIEF DESCRIPTION OF THE DRAWINGS

The exemplary embodiments will be described in detail with reference to the accompanying drawings, through which the above and other features and advantages of the disclosure will become more apparent.

FIG. 4 is a flow diagram of a voltage detection method of a modular multilevel converter system according to the invention.

FIG. 10A illustrates a current flow direction when an upper switch of a first sub-module and an upper switch of a second sub-module of the modular multilevel converter system shown in FIG. 1B are normally turned on.

FIG. 12A illustrates a current flow direction when a lower switch in a first sub-module and a lower switch in a second sub-module of the modular multilevel converter system shown in FIG. 1B are normally turned on.

FIG. 14A illustrates a current flow direction when an upper switch in a first sub-module and an upper switch in a second sub-module of the modular multilevel converter system shown in FIG. 1B are normally turned on.

FIG. 15A illustrates a current flow direction when a lower switch in a first sub-module and a lower switch in a second sub-module of the modular multilevel converter system shown in FIG. 1B are normally turned on.

FIG. 18A illustrates a current flow direction when an upper left switch of a first sub-module and an upper left switch of a second sub-module of the modular multilevel converter system shown in FIG. 3 are normally turned on.

FIG. 19A illustrates a current flow direction when a lower left switch in a first sub-module and a lower left switch in a second sub-module of the modular multilevel converter system shown in FIG. 3 are normally turned on.

FIG. 20A illustrates a current flow direction when an upper left switch in a first sub-module and an upper left switch in a second sub-module in the modular multilevel converter system shown in FIG. 3 are normally turned on.

FIG. 21A illustrates a current flow direction when a lower left switch in a first sub-module and a lower left switch in a second sub-module of the modular multilevel converter system shown in FIG. 3 are normally turned on.

FIG. 22A illustrates a current flow direction when a lower right switch in a first sub-module and a lower right switch in a second sub-module of the modular multilevel converter system shown in FIG. 3 are normally turned on.

FIG. 23A illustrates a current flow direction when a lower right switch in a first sub-module and a lower right switch in a second sub-module of the modular multilevel converter system shown in FIG. 3 are normally turned on.

DETAILED EMBODIMENTS OF THE INVENTION

Figure 1A:
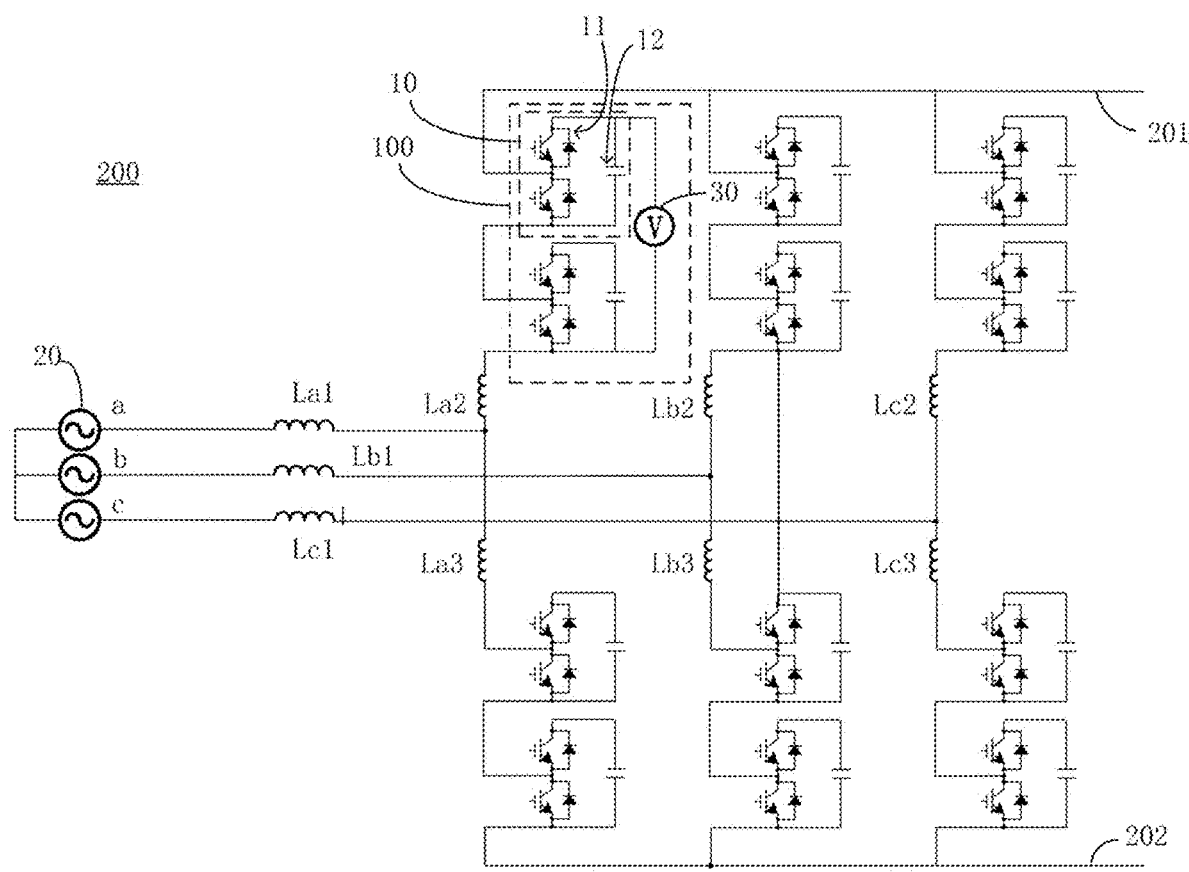
FIG. 1A is a structural diagram of a modular multilevel converter system according to the invention.

The exemplary embodiments will now be described more fully with reference to the accompanying drawings. However, the exemplary embodiments can be implemented in various forms and shall not be understood as being limited to the embodiments set forth herein; on the contrary, these embodiments are provided so that this invention will be thorough and complete, and the conception of exemplary embodiments will be fully conveyed to those skilled in the art. In the drawings, the same reference sign denotes the same or similar structure, so their detailed description will be omitted.

When factors/components/the like described and/or illustrated here are introduced, the phrases "one", "a(an)", "the", "said" and "at least one" refer to one or more factors/components/the like. The terms "include", "comprise" and "have" refer to an open and included meaning, and refer to additional factors/components/the like, in addition to the listed factors/components/the like. The embodiments may use relative phrases, such as, "upper" or "lower" to describe a relative relation of one signed component over another component. It shall be understood that if the signed device reverses to turn upside down, the described component on an "upper" side will become a component on a "lower" side. Also, the terms "first", "second" and the like in the claims are only used as signs, instead of numeral limitations to objects.

FIG. 1A is a structural diagram of a modular multilevel converter system 200 according to one embodiment of the invention. As shown in FIG. 1A, the modular multilevel converter system 200 has three phases a, b and c. Each phase includes two branches, for example, upper and lower branches, and each branch includes one inductor and N sub-modules 10 cascaded. For example, the upper branch of phase a in FIG. 1A includes two sub-modules 10 and an inductor La2 connected in series, and the lower branch of phase a includes two sub-modules 10 and an inductor La3 connected in series. Moreover, output terminals of the upper branch and the lower branch of phase a are connected to output buses 201 and 202, respectively, and a middle node between the inductor La2 of the upper branch and the inductor La3 of the lower branch is connected to an AC power 20 of phase a via an inductor La1. Branch circuits of phases b and c are similar to the branch circuit of phase a in structure. That is, the upper branch of phase b includes two sub-modules 10 and an inductor Lb2 connected in series, and the lower branch of phase b includes two sub-modules 10 and an inductor Lb3 connected in series. Moreover, output terminals of the upper branch and the lower branch of phase b are connected to the output buses 201 and 202, respectively, and a middle node between the inductor La2 of the upper branch and the inductor La3 of the lower branch is connected to an AC power 20 of phase b via an inductor Lb1. The upper branch of phase c includes two sub-modules 10 and an inductor Lc2 connected in series, and the lower branch of phase c includes two sub-modules 10 and an inductor Lc3 connected in series. Moreover, output terminals of the upper branch and the lower branch of phase c are connected to the output buses 201 and 202, respectively, and a middle node between the inductor Lc2 of the upper branch and the inductor Lc3 of the lower branch is connected to an AC power 20 of phase c via an inductor Lc1.

The modular multilevel converter system of the invention may include, for example, N sub-modules 10 and a voltage detection unit 30. The N sub-modules 10 are sequentially cascaded, where N is an integer greater than or equal to 2, each of the sub-modules 10 comprises at least one bridge arm 11 and a capacitor 12 connected in parallel to the bridge arm 11, and the capacitor 12 has a positive terminal and a negative terminal. The voltage detection unit 30 detects a voltage between at least two adjacent sub-modules in the N sub-modules 10 and is connected between the positive terminal of the capacitor 12 of the first sub-module 10 and the negative terminal of the capacitor 12 of the last sub-module 10 in the at least two sub-modules.

Figure 1B:
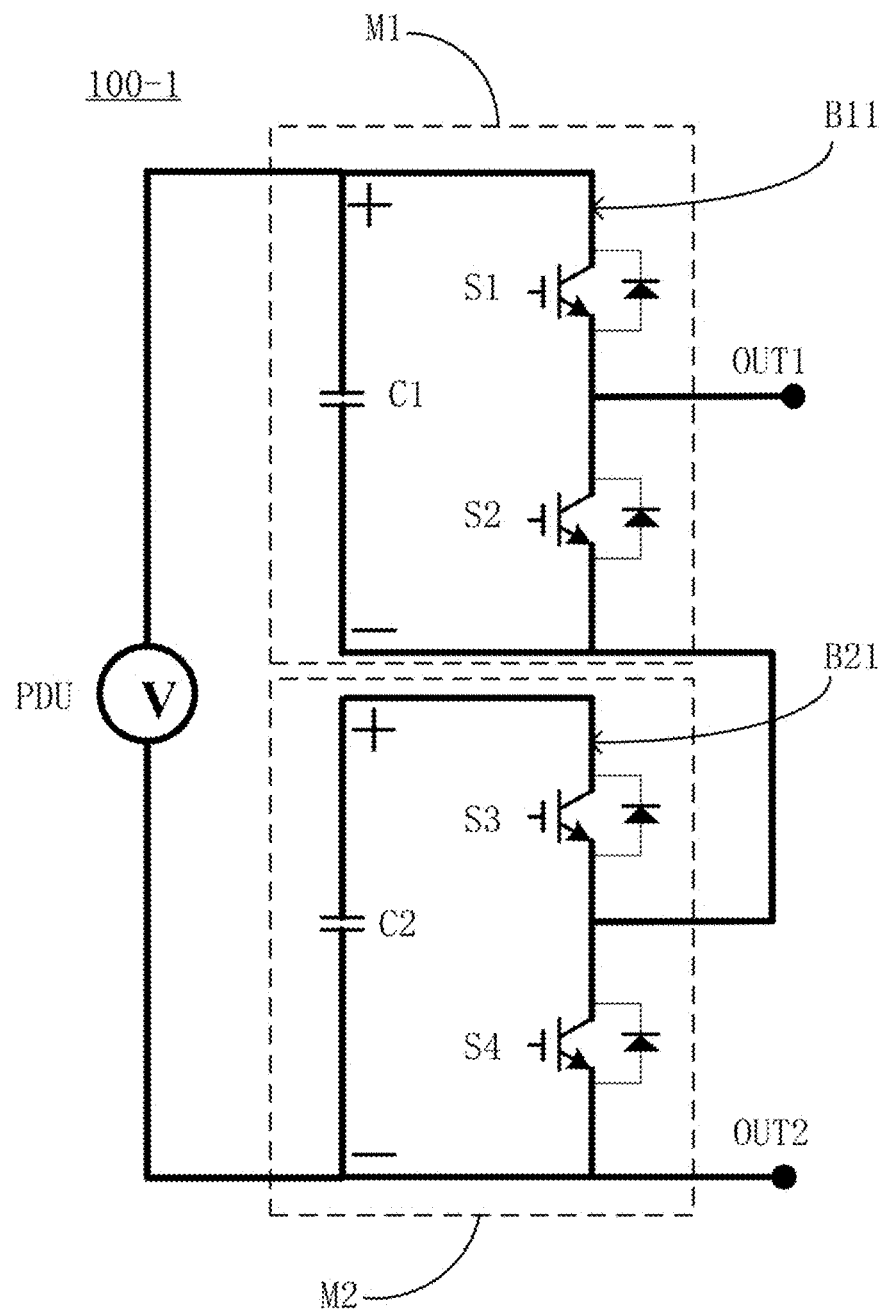
FIG. 1B is a schematic diagram illustrating a partial structure of a modular multilevel converter system according to an embodiment of the invention, wherein a voltage detection unit detects voltages of two sub-modules.

FIG. 1B is a schematic diagram illustrating a partial structure 100-1 of a modular multilevel converter system according to the invention, where a voltage detection unit PDU measures voltages of the two sub-modules. As shown in FIG. 1B, in some embodiments, the two sub-modules may include, for example, a first sub-module (i.e., an upper sub-module) M1 and a second sub-module (i.e., a lower sub-module) M2 sequentially cascaded, each sub-module comprising at least one bridge arm and a capacitor connected in parallel to the bridge arm.

Specifically, in the embodiment shown in FIG. 1B, the first sub-module M1 and the second sub-module M2 may be in a half-bridge structure. For example, the first sub-module M1 may comprise a bridge arm B11 and a first capacitor C1 connected in parallel to the bridge arm B11, the first capacitor C1 has a positive terminal (+) and a negative terminal (−), the bridge arm B11 may comprise a first switch S1 (such as an upper switch of the bridge arm B11) and a second switch S2 (such as a lower switch of the bridge arm B11) connected in series, and an output terminal OUT1 of the first sub-module M1, for example, is connected to a middle node between the first switch S1 and the second switch S2. The second sub-module M2 may comprise a bridge arm B21 and a second capacitor C2 connected in parallel to the bridge arm B21, the second capacitor C2 has a positive terminal (+) and a negative terminal (−), and the bridge arm B21 may comprise a third switch S3 (such as an upper switch of the bridge arm B21) and a fourth switch S4 (such as a lower switch of the bridge arm B21) connected in series. The negative terminal of the first capacitor C1 of the first sub-module M1 and a middle node between the third switch S3 and the fourth switch S4 are connected to form a cascade structure, and the negative terminal of the second capacitor C2 leads out an output terminal OUT2 of the second sub-module M2. In this embodiment, these switches S1-S4, for example, may be IGBTs, but it shall be understood that in other embodiments, these switches can also be other types of switches, and the invention is not limited thereto.

In the embodiment shown in FIG. 1B, the voltage detection unit PDU is connected between the positive terminal (+) of the first capacitor C1 of the first sub-module M1 and the negative terminal (−) of the second capacitor C2 of the second sub-module M2 and can detect a voltage between the two adjacent sub-modules M1 and M2. In the invention, the voltage detection unit PDU, for example, may be a voltage sensor, but the invention is not limited thereto.

Figure 2:
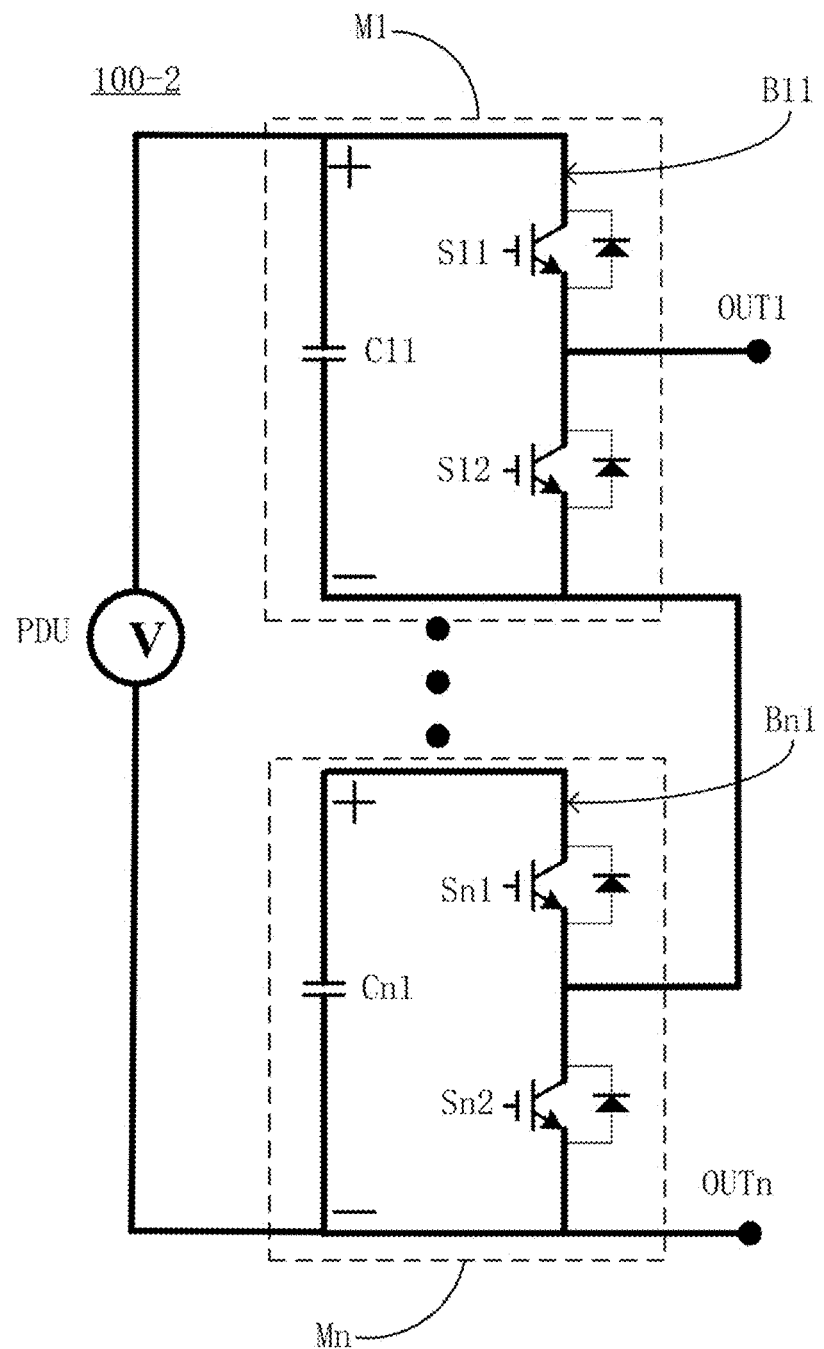
FIG. 2 is a schematic diagram illustrating a partial structure of a modular multilevel converter system according to another embodiment of the invention, wherein a voltage detection unit detects voltages of a plurality of sub-modules.

FIG. 2 is a schematic diagram illustrating a partial structure 100-2 of another modular multilevel converter system according to the invention, wherein a voltage detection unit PDU is connected to n sub-modules, where n is an integer greater than or equal to 2. The n sub-modules may, for example, comprise a first sub-module M1, . . . , an n-th sub-module Mn sequentially cascaded.

In these sub-modules M1-Mn, each sub-module may comprise at least one bridge arm and a capacitor connected in parallel to the bridge arm, and each sub-module may be in a half-bridge structure. For example, the first sub-module M1 may comprise a bridge arm B11 and a capacitor C11 connected in parallel to the bridge arm B11, the bridge arm B11 comprises a first switch S11 (such as an upper switch of the bridge arm B11) and a second switch S12 (such as a lower switch of the bridge arm B11) connected in series, an output terminal OUT1 of the first sub-module M1, for example, is connected to a middle node between the first switch S11 and the second switch S12, and the capacitor C11 has a positive terminal (+) and a negative terminal (−). The n-th sub-module Mn may comprise a bridge arm Bn1 and a capacitor Cn1 connected in parallel to the bridge arm Bn1, the capacitor Cn1 has a positive terminal (+) and a negative terminal (−), a middle node between the first switch Sn1 and the second switch Sn2 in the bridge arm Bn1 is connected to the negative terminal of the capacitor in the previous sub-module, and an output terminal OUTn of the n-th sub-module Mn, for example, is the negative terminal of the capacitor Cn1.

In the embodiment shown in FIG. 2, the voltage detection unit PDU is connected between the positive terminal (+) of the capacitor C11 of the first sub-module M1 and the negative terminal (−) of the capacitor Cn1 of the last sub-module Mn and can detect a voltage between the adjacent N sub-modules M1-Mn.

Figure 3:
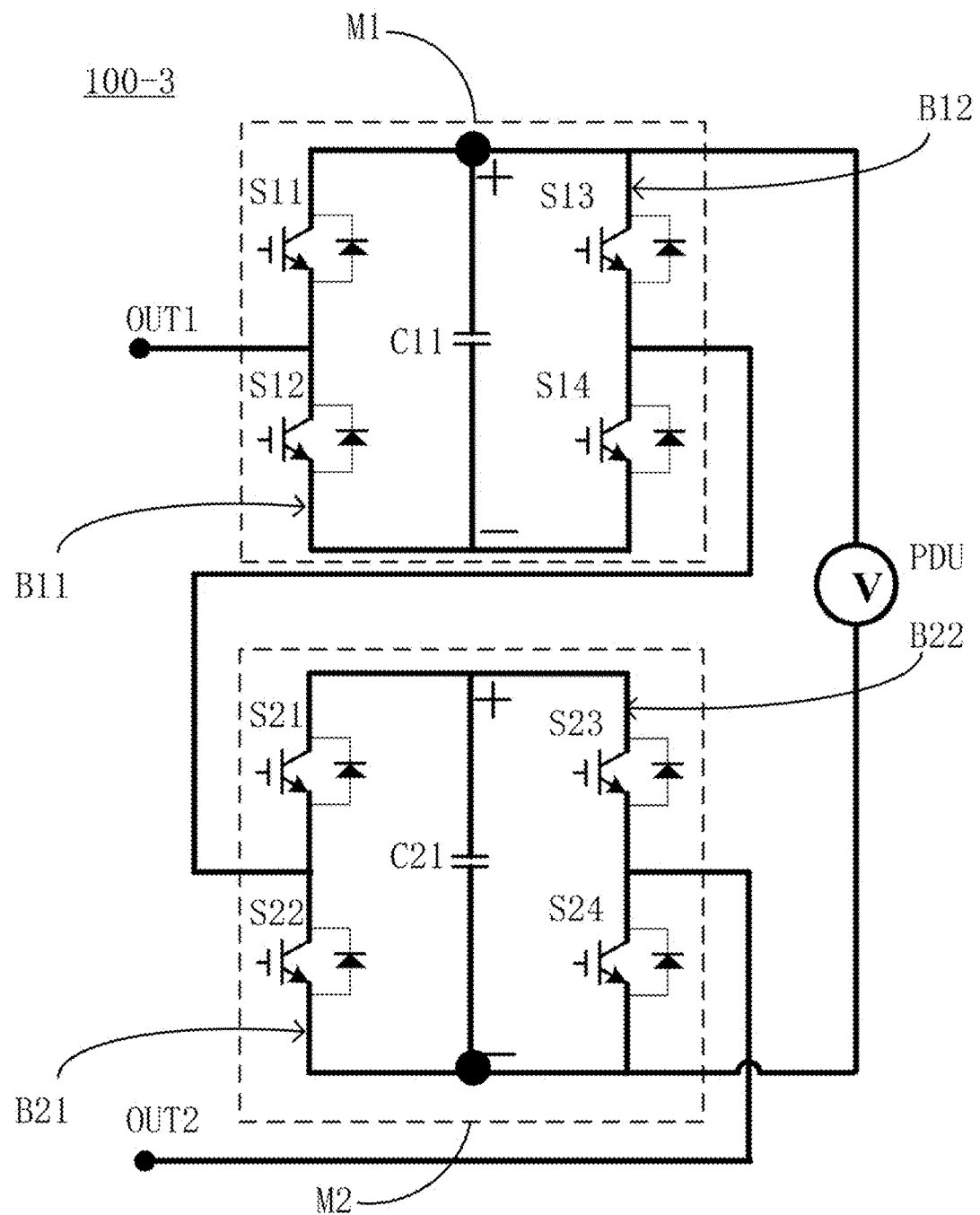
FIG. 3 is a schematic diagram illustrating a partial structure of a modular multilevel converter system according to still another embodiment of the invention, wherein a circuit structure of the sub-modules is an H bridge structure.

As shown in FIG. 3, a partial structure 100-3 of still another modular multilevel converter system according to the invention is similar to that in the embodiment shown in FIG. 1B, i.e., it also includes two sub-modules M1 and M2 sequentially cascaded and a voltage detection unit PUD, and the difference is that the two sub-modules M1 and M2 are in an H bridge structure. For example, the first sub-module M1 may comprise a first bridge arm B11 and a second bridge arm B12 connected in parallel to the first bridge arm B11, the first bridge arm B11 may comprise a first switch S11 (an upper left switch) and a second switch S12 (a lower left switch) connected in series, and the second bridge arm B12 may comprise a third switch S13 (an upper right switch) and a fourth switch S14 (a lower right switch) connected in series. A capacitor C11 is connected in parallel with the first bridge arm B11 and the second bridge arm B12. The second sub-module M2 may comprise a first bridge arm B21 and a second bridge arm B22 connected in parallel to the first bridge arm B21, the first bridge arm B21 may comprise a first switch S21 (an upper left switch) and a second switch S22 (a lower left switch) connected in series, and the second bridge arm B22 may comprise a third switch S23 (an upper right switch) and a fourth switch S24 (a lower right switch) connected in series. A capacitor C21 is connected in parallel with the first bridge arm B21 and the second bridge arm B22.

In the embodiment shown in FIG. 3, the voltage detection unit PUD is connected between the positive terminal (+) of the capacitor C11 of the first sub-module M1 and the negative terminal (−) of the capacitor C21 of the second sub-module M2 and can detect a voltage between the two adjacent sub-modules M1 and M2.

As shown in FIG. 4, a voltage detection method 40 of a modular multilevel converter system according to the invention mainly comprises:

Step S41, configuring N sub-modules sequentially cascaded, where N is an integer greater than or equal to 2, each of the sub-modules comprising at least one bridge arm and a capacitor connected in parallel to the bridge arm, the capacitor having a positive terminal and a negative terminal; and Step S42, configuring a voltage detection unit for detecting a voltage between at least two adjacent sub-modules in the N sub-modules and connected between the positive terminal of the capacitor of the first sub-module and the negative terminal of the capacitor of the last sub-module in the at least two sub-modules.

Hereinafter, referring to FIGS. 5A-8, taking the partial structure 100-1 of the modular multilevel converter system shown in FIG. 1B for example, the voltage detection method of the invention is explained in detail. The voltage detection unit PDU can detect the voltage between the two adjacent sub-modules M1 and M2.

Figure 5A:
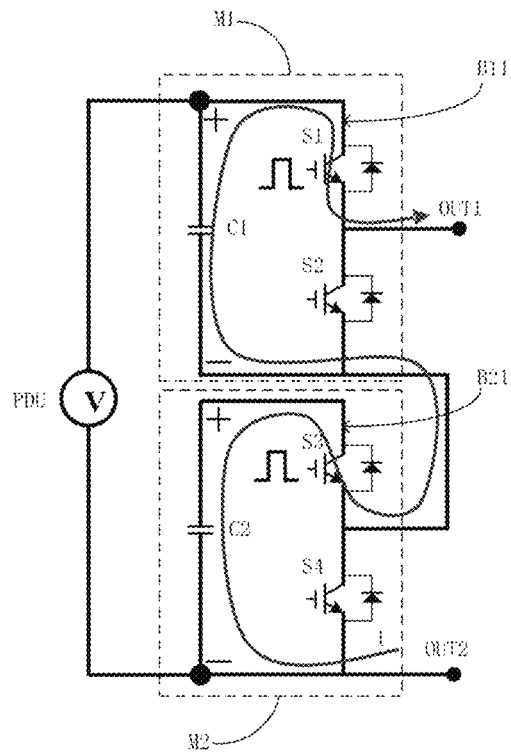
FIGS. 5A and 5B respectively illustrate current flow directions and states when the two sub-modules in the modular multilevel converter system shown in FIG. 1B are in a switch-on state (upper switches are turned on).
Figure 5B:
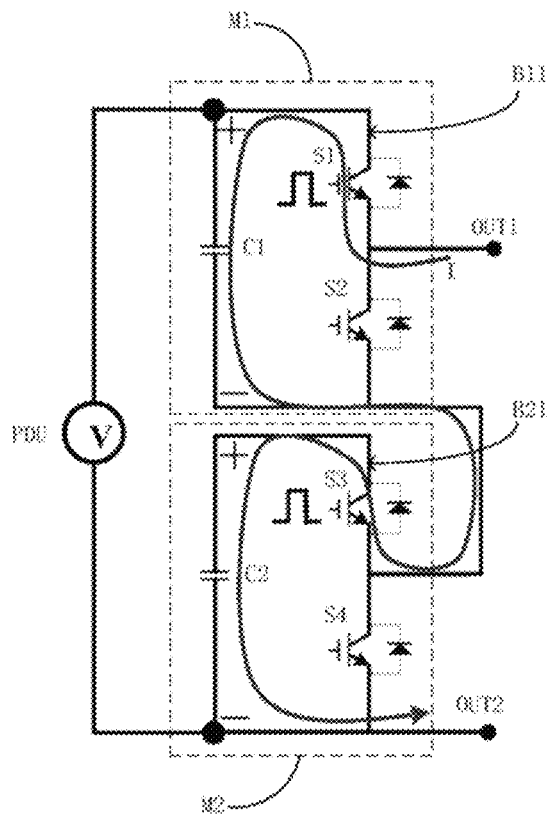
Figure 6A:
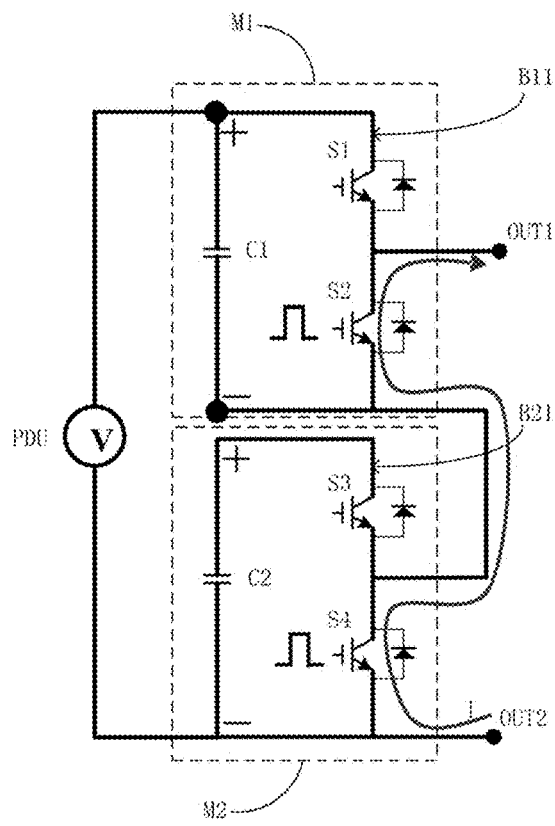
FIGS. 6A and 6B respectively illustrate current flow directions and states when the two sub-modules in the modular multilevel converter system shown in FIG. 1B are in a switch out state (lower switches are turned on).
Figure 6B:
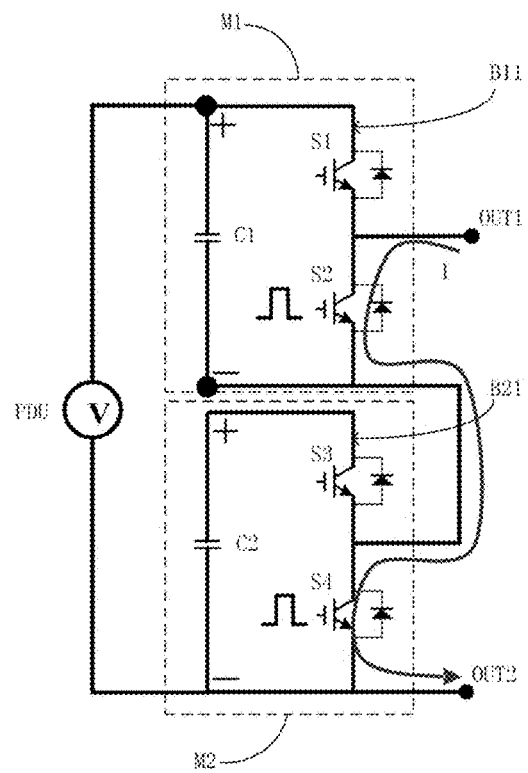

As shown in FIGS. 5A-5B, during normal operation, when the two sub-modules M1-M2 are in a switch-on state (i.e., the first switch S1 and the third switch S3 are turned on, and the second switch S2 and the fourth switch S4 are turned off), no matter whether current I flows from the output terminal OUT2 of the second sub-module M2 to the output terminal OUT1 of the first sub-module M1 (shown in FIG. 5A), or flows from the output terminal OUT1 of the first sub-module M1 to the output terminal OUT2 of the second sub-module M2 (shown in FIG. 5B), a detection result from the voltage detection unit PDU is always a sum of capacitor voltages of the two sub-modules M1-M2.

During normal operation, when the two sub-modules M1-M2 are in a switch-off state (i.e., the second switch S2 and the fourth switch S4 are turned on, and the first switch S1 and the third switch S3 are turned off), no matter whether current I flows from the output terminal OUT2 of the second sub-module M2 to the output terminal OUT1 of the first sub-module M1 (shown in FIG. 6A), or flows from the output terminal OUT1 of the first sub-module M1 to the output terminal OUT2 of the second sub-module M2 (shown in FIG. 6B), a detection result from the voltage detection unit PDU is always a capacitor voltage of the first sub-module M1.

Figure 7A:
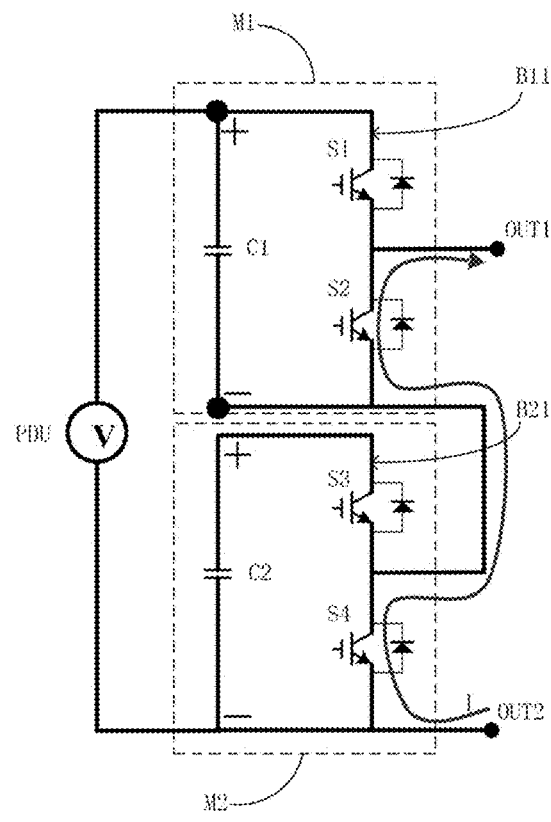
FIGS. 7A and 7B respectively illustrate current flow directions and states when the two sub-modules in the modular multilevel converter system shown in FIG. 1B are in a locked state (all switches are turned off).

During normal operation, when the two sub-modules M1-M2 are in a blocked state (i.e., the first switch S1, the third switch S3, the second switch S2, and the fourth switch S4 are turned off), and current I flows from the output terminal OUT2 of the second sub-module M2 to the output terminal OUT1 of the first sub-module M1, as shown in FIG. 7A, a detection result from the voltage detection unit PDU is the capacitor voltage of the first sub-module M1.

Figure 7B:
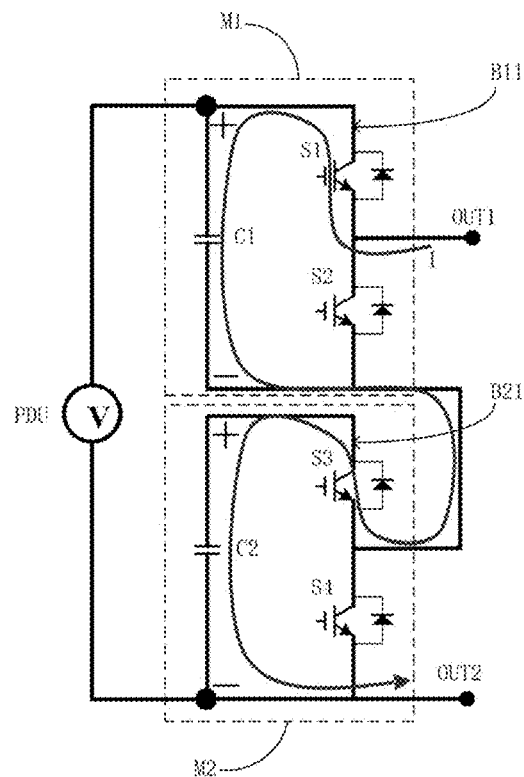

During normal operation, when the two sub-modules M1-M2 are in the blocked state (i.e., the first switch S1, the third switch S3, the second switch S2, and the fourth switch S4 are turned off), and current I flows from the output terminal OUT1 of the first sub-module M1 to the output terminal OUT2 of the second sub-module M2, as shown in FIG. 7B, a detection result from the voltage detection unit PDU is the sum of capacitor voltages of the two sub-modules M1-M2.

Figure 8:
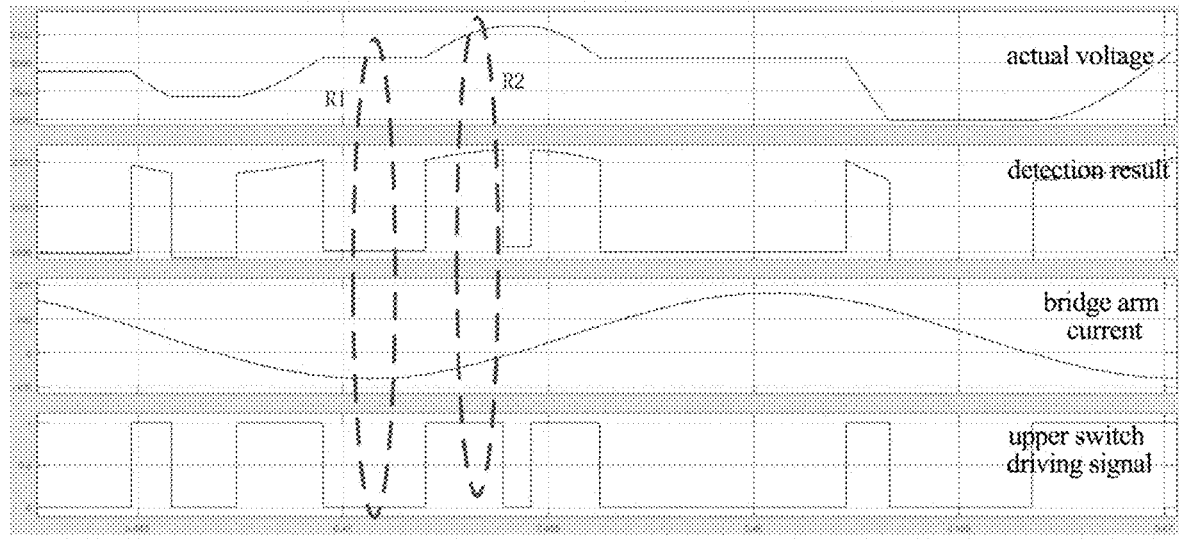
FIG. 8 illustrates simulation waveforms in the voltage detection method for detecting voltages of the two sub-modules using a single voltage sensor in the modular multilevel converter system according to the invention.

FIG. 8 illustrates simulation waveforms in the voltage detection method for detecting voltages of the two sub-modules using the voltage detection unit PDU according to the present invention. In the invention, when a detection result from the voltage detection unit PDU is a capacitor voltage of the single sub-module, a capacitor is in a voltage holding mode, and the capacitor voltage of the first sub-module M1 is measured, such as a first dotted line circle R1 in FIG. 8. When a detection result from the voltage detection unit PDU is the capacitor voltages of the two sub-modules, a capacitor of the sub-modules is in charging and discharging mode, and a sum of capacitor voltages of the two sub-modules is measured, such as a second dotted line circle R2 in FIG. 8. Therefore, in the invention, a real-time voltage of each sub-module can be estimated through single or two voltage values at the previous time. For example, a capacitor voltage of the second sub-module M2 can be estimated by subtracting the detected capacitor voltage of the first sub-module M1 from the detected sum of capacitor voltages of the two sub-modules M1-M2. Taking FIG. 8 for example, the voltage measured in the first dotted line circle R1 is the capacitor voltage of the first sub-module M1, and the voltage measured in the second dotted line circle R2 is the sum of capacitor voltages of the two sub-modules M1 and M2, so the capacitor voltage of the second sub-module M2 can be estimated by subtracting the voltage measured in the first dotted line circle R1 from the voltage measured in the second dotted line circle R2.

Hereinafter, referring to FIGS. 9-16, taking the partial structure 100-1 of the modular multilevel converter system shown in FIG. 1B as an example, an open-circuit fault diagnosis method of the invention is explained in detail.

Figure 9:
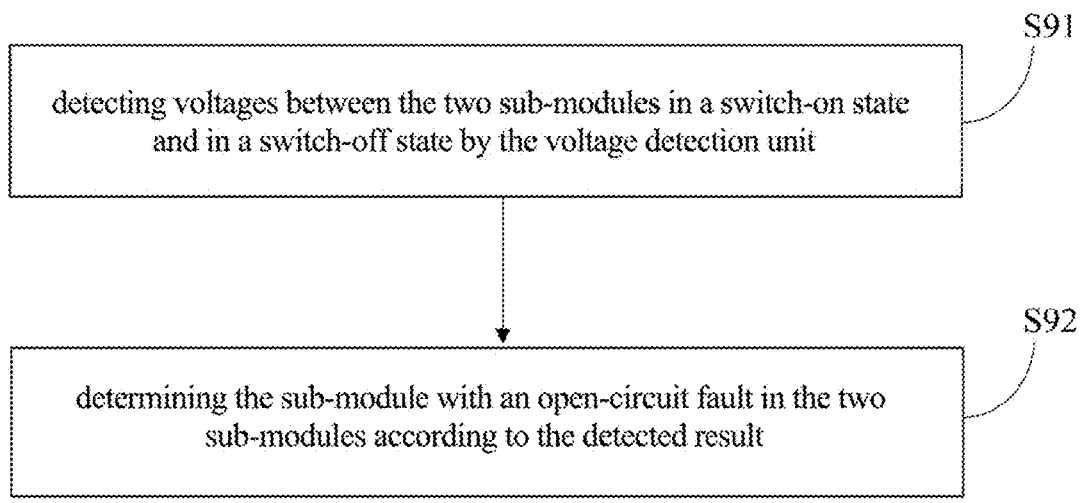
FIG. 9 is a flow diagram of an open-circuit fault diagnosis method for a modular multilevel converter system according to the invention.

As shown in FIG. 9, the open-circuit fault diagnosis method comprises:

Step S91, detecting voltages between the two sub-modules in a switch-on state and a switch-off state by the voltage detection unit;

Step S92, determining the sub-module with an open-circuit fault in the two sub-modules according to the detected result.

Figure 10A:
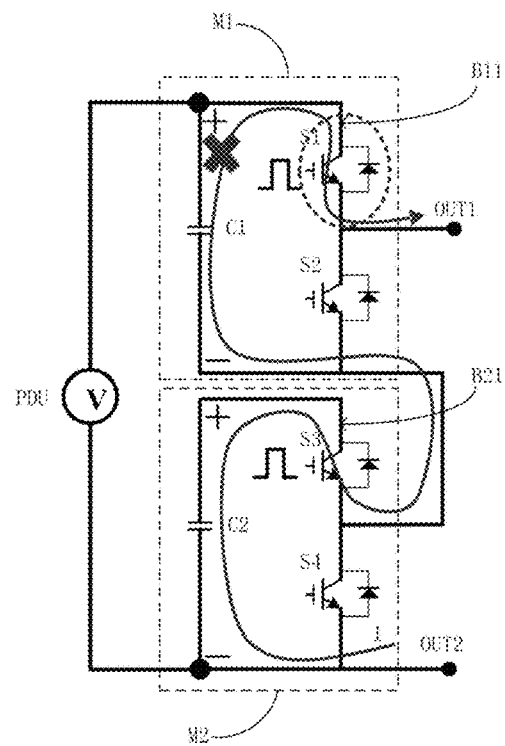
Figure 10B:
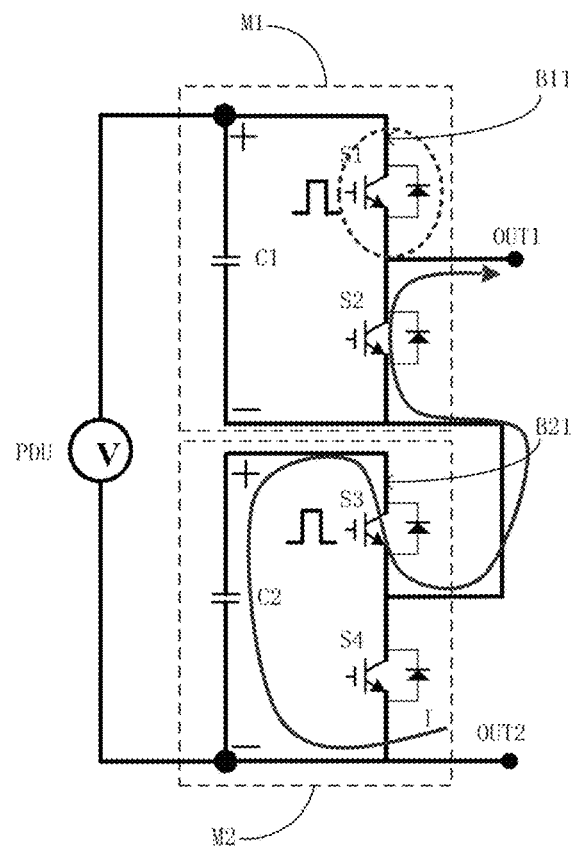
FIG. 10B illustrates a current flow direction when an open-circuit fault occurs on the upper switch in the first sub-module in FIG. 10A.

FIGS. 10A and 10B illustrate states before and after an open-circuit fault occurs on the first switch S1 of the first sub-module M1. FIG. 10A is a current flow direction when the switches are in normal operation. For example, current passes sequentially through the second capacitor C2, the third switch S3, the first capacitor C1, and the first switch S1 from the output terminal OUT2, and flows out from OUT1. However, when the first switch S1 is open, the current cannot flow out from the switch S1, and can only be forced to flow out from an antiparallel diode of the second switch S2, as shown in FIG. 10B. When the first switch S1 in the first sub-module M1 is in open-circuit fault, a discharge circuit for the capacitor C1 in the first sub-module M1 is cut off, and the voltage of the first capacitor C1 can only vary in a single direction, which results in a DC bias.

Figure 11:
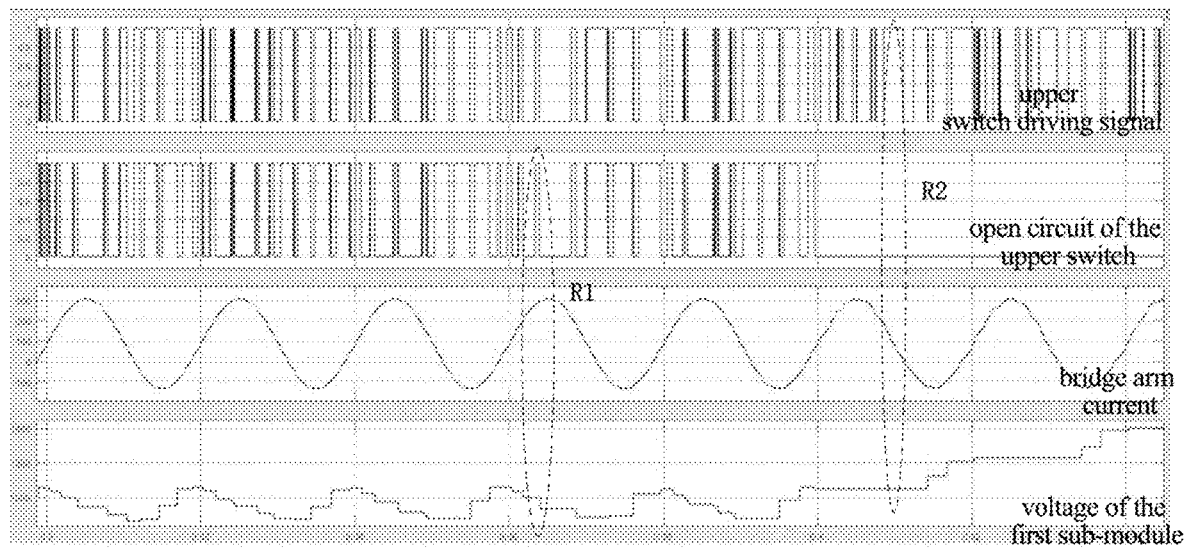
FIG. 11 illustrates simulation waveforms when the open-circuit fault occurs on the upper switch in the first sub-module.

FIG. 11 illustrates simulation waveforms when an open-circuit fault occurs on the first switch S1 in the first sub-module M1. A positive current represents a current flowing out from the sub-module, and a discharging state is changed to a voltage holding state after the open-circuit fault. As can be seen from FIGS. 10A, 10B, and 11, in the first dotted line circle R1, the switches operate normally, and the first capacitor C1 is charged and discharged normally. When the first switch S1 in the first sub-module M1 is open-circuit fault, the discharge circuit for the first capacitor C1 in the first sub-module M1 is cut off, the capacitor voltage of the first sub-module M1 cannot be discharged, and the capacitor voltage is shown as the second dotted line circle R2, which cannot be decreased as the first dotted line circle R1, so a DC bias occurs. The DC bias means that an average voltage value (such as the capacitor voltage of the first capacitor C1) during one or more power frequency cycles is no longer maintained near a stable value, and thus is deviated from the stable value. For example, normally, the average voltage value of the capacitor voltage of the first sub-module is stabilized near 1000V, and when the first switch S1 in the first sub-module M1 is in open-circuit fault, the average voltage value of the first sub-module is gradually increased to 1200V, even 1500V. Accordingly, the characteristic of the DC bias can serve as a judgment for open-circuit fault diagnosis of the first switch S1 of the first sub-module M1. Therefore, in some embodiments, when a DC bias is detected on the capacitor voltage of the first sub-module M1, and for example, the DC bias exceeds a first preset threshold, it is determined that an open-circuit fault occurs on the first switch S1 in the first sub-module M1. In some embodiments, the first preset threshold can be set to 1.3 times a rated average voltage value of the sub-module, but the invention is not limited thereto.

Figure 12A:
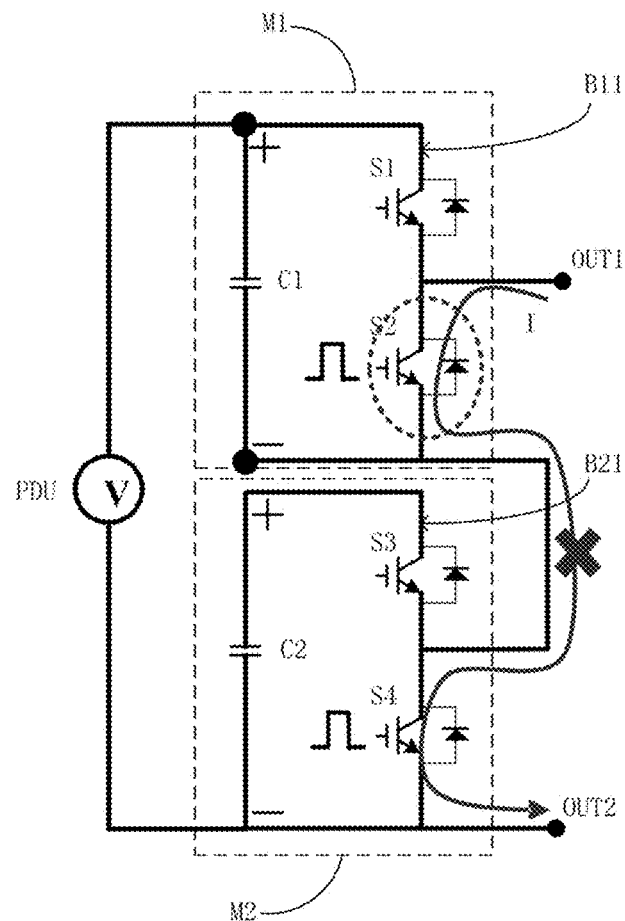
Figure 12B:
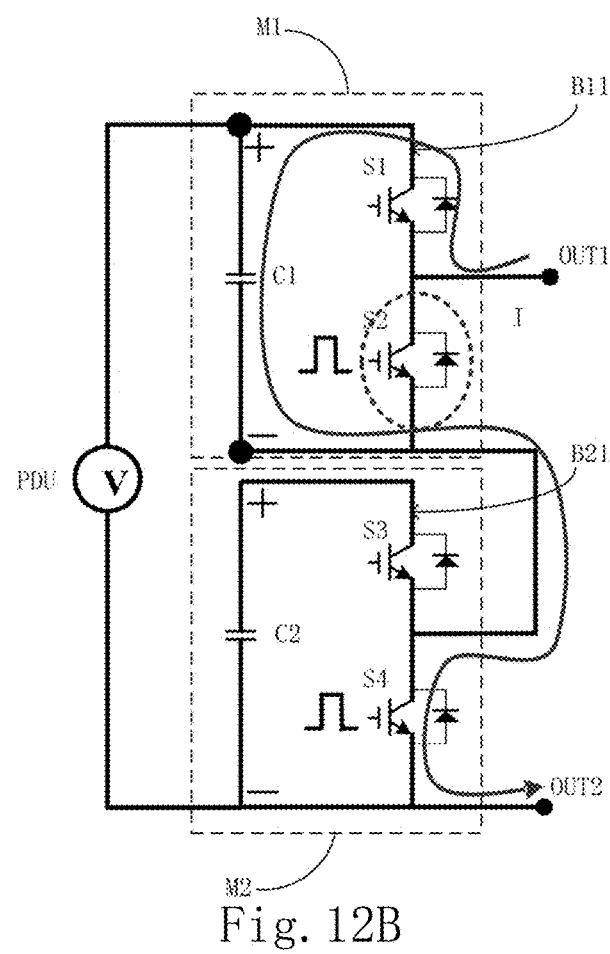
FIG. 12B illustrates a current flow direction when an open-circuit fault occurs on the lower switch in the first sub-module in FIG. 12A.

FIGS. 12A and 12B illustrate states before and after an open-circuit fault occurs on the second switch S2 in the first sub-module M1. FIG. 12A illustrates a current flow direction when the switches operate normally, and the second switch S2 in the first sub-module M1 and the fourth switch S4 in the second sub-module M2 are turned on. At this time, current flows from the output terminal OUT1 to the output terminal OUT2 through the second switch S2 and the fourth switch S4. A detection result from the voltage detection unit PDU is the capacitor voltage of the sub-module M1, and the capacitor voltage of the first capacitor C1 keeps unchanged. However, when the second switch S2 of the first sub-module M1 is in open-circuit fault, the current path above mentioned is cut off, the antiparallel diode of the first switch S1 in the first sub-module M1 is forced to be turned on continuously, and the first capacitor C1 joins in conduction loop, so the voltage holding state is cut off during charging, such that the capacitor voltage of the first capacitor C1 rises.

Figure 13:
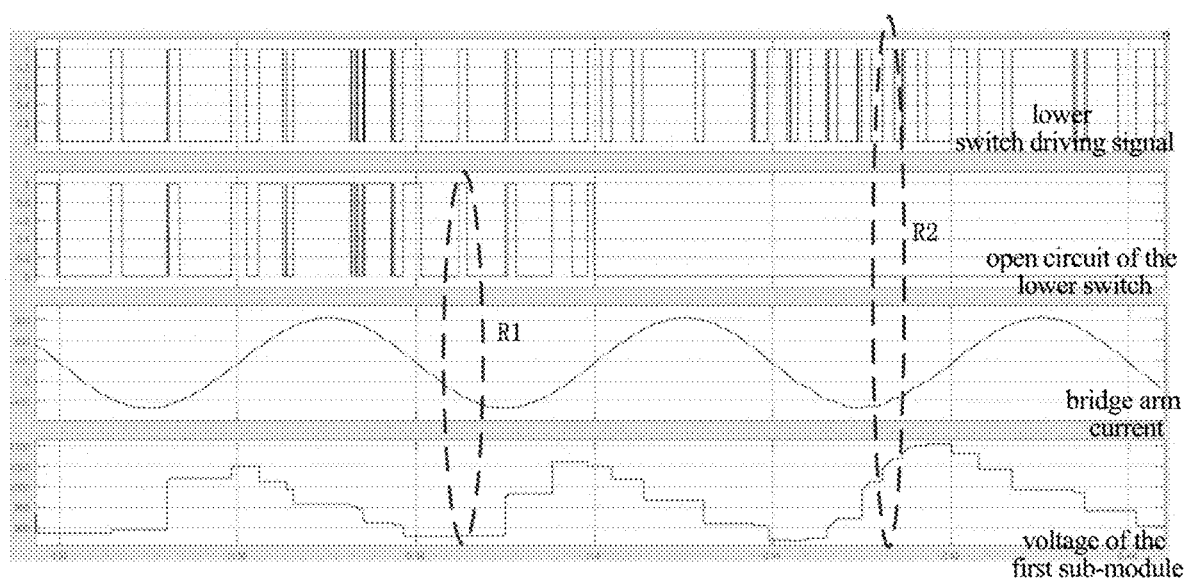
FIG. 13 illustrates simulation waveforms when the open-circuit fault occurs on the lower switch in the first sub-module.

FIG. 13 illustrates simulation waveforms when an open-circuit fault occurs on the second switch S2 in the first sub-module M1. A negative current represents the current flowing into the sub-module, and the voltage holding state is changed to a charging state after the open-circuit fault. As can be seen from FIGS. 12A, 12B, and 13, the open-circuit fault of the second switch S2 in the first sub-module M1 only influences the charging state of the first capacitor C1, which result in a continued charging state, and voltage cannot be maintained. Therefore, the characteristic of voltage holding during charge can serve as a judgment for open-circuit fault diagnosis of the second switch S2 in the first sub-module M1. In some embodiments, when current flows from the output terminal OUT1 of the first sub-module M1 to the output terminal OUT2 of the second sub-module M2, i.e., the voltage rises at several voltage holding states, and a sum of several voltage variations $\Delta U$ is greater than a second preset threshold, for example, $\Delta U1+\Delta U2 \ldots +\Delta Un > U_{ref}$, it can be determined that the open-circuit fault occurs on the second switch S2 in the first sub-module M1. As shown in FIG. 13, in the first dotted line circle R1, the switches operate normally, current flows from the output terminal OUT1 to the output terminal OUT2 through the second switch S2 and the fourth switch S4. At this time, the capacitor voltage is normal. When an open-circuit fault occurs on the second switch S2 in the first sub-module M1, the first capacitor C1 is charged, and the capacitor voltage of the first capacitor C1 rises in the second dotted line circle R2, and when the sum of voltage variations reach the second preset threshold, it is judged that fault occurs. In some embodiments, the second preset threshold can be set to 30% of a rated average voltage value of the capacitor voltage of the sub-modules, and when the second preset threshold is greater than 30% of the rated average voltage value of the sub-modules, it can be considered that the open-circuit fault occurs on the lower switch S2 in the first sub-module M1. The second preset threshold can be set according to actual needs, but the invention is not limited thereto.

Figure 14A:
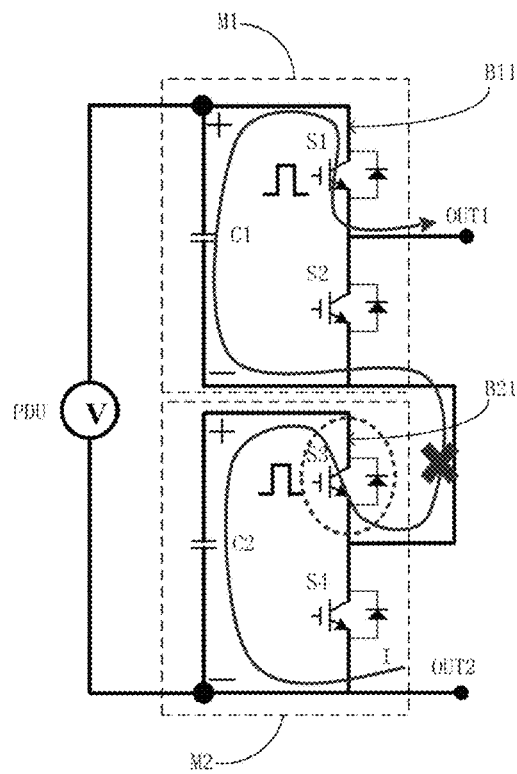
Figure 14B:
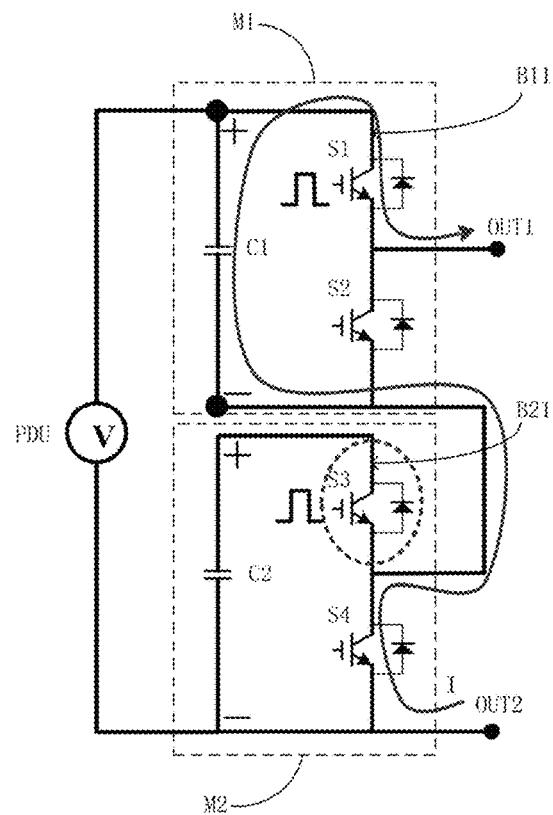
FIG. 14B illustrates a current flow direction when an open-circuit fault occurs on the upper switch in the second sub-module in FIG. 14A.

FIGS. 14A and 14B illustrate states before and after an open-circuit fault occurs on the third switch S3 in the second sub-module M2. During normal operation, the first switch S1 in the first sub-module M1 and the third switch S3 in the second sub-module M2 are turned on, i.e., the two sub-modules M1-M2 are in a switch-on state, and a detection result from the voltage detection unit PDU is a sum of capacitor voltages of the two sub-modules, as shown in FIG. 14A. However, when the third switch S3 in the second sub-module M2 is with an open-circuit fault, the current is forced to flow from an antiparallel diode of the fourth switch S4 in the second sub-module M2. So when the sub-modules are in the switch-on state, there may be a situation where only the capacitor voltage of the first sub-module M1 is measured and the characteristic (i.e., the capacitor voltage of the first sub-module M1) can serve to diagnose the open-circuit fault of the third switch S3 in the second sub-module M2.

Figure 15A:
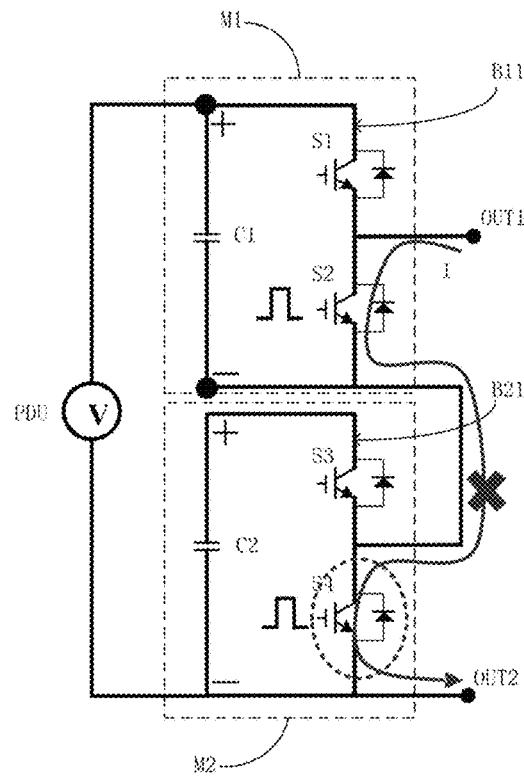
Figure 15B:
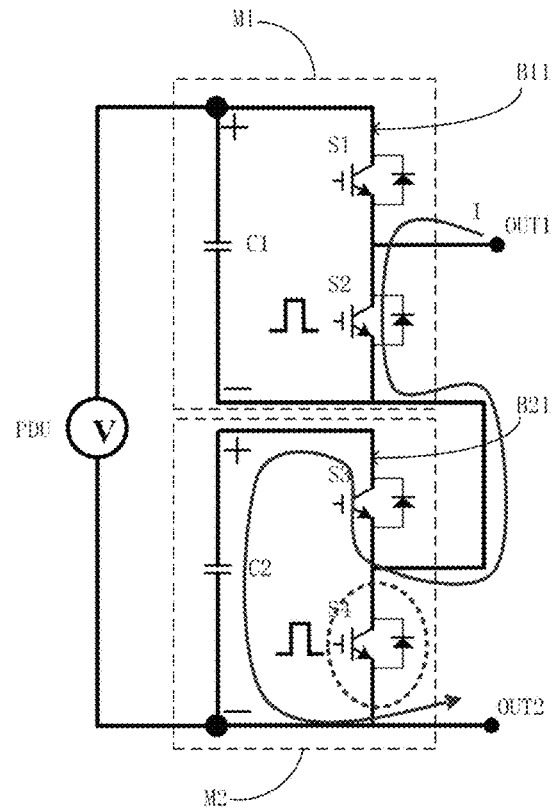
FIG. 15B illustrates a current flow direction when an open-circuit fault occurs on the lower switch in the second sub-module in FIG. 15A.

FIGS. 15A and 15B illustrate states before and after an open-circuit fault occurs on the fourth switch S4 in the second sub-module M2. During normal operation, the second switch S2 in the first sub-module M1 and the fourth switch S4 in the second sub-module M2 are turned on, i.e., the two sub-modules M1-M2 are in a switch-off state, and a detection result from the voltage detection unit PDU is the capacitor voltage of the first sub-module M1, as shown in FIG. 15A. However, when the fourth switch S4 in the second sub-module M2 is in open-circuit fault, the current is forced to flow from an antiparallel diode of the third switch S3 in the second sub-module M2, so when the sub-modules are in the switch-off state, there may be a situation where a sum of capacitor voltages of the two sub-modules M1-M2 is measured, and the characteristic can serve to diagnose the open-circuit fault of the fourth switch S4 in the second sub-module M2.

Figure 16:
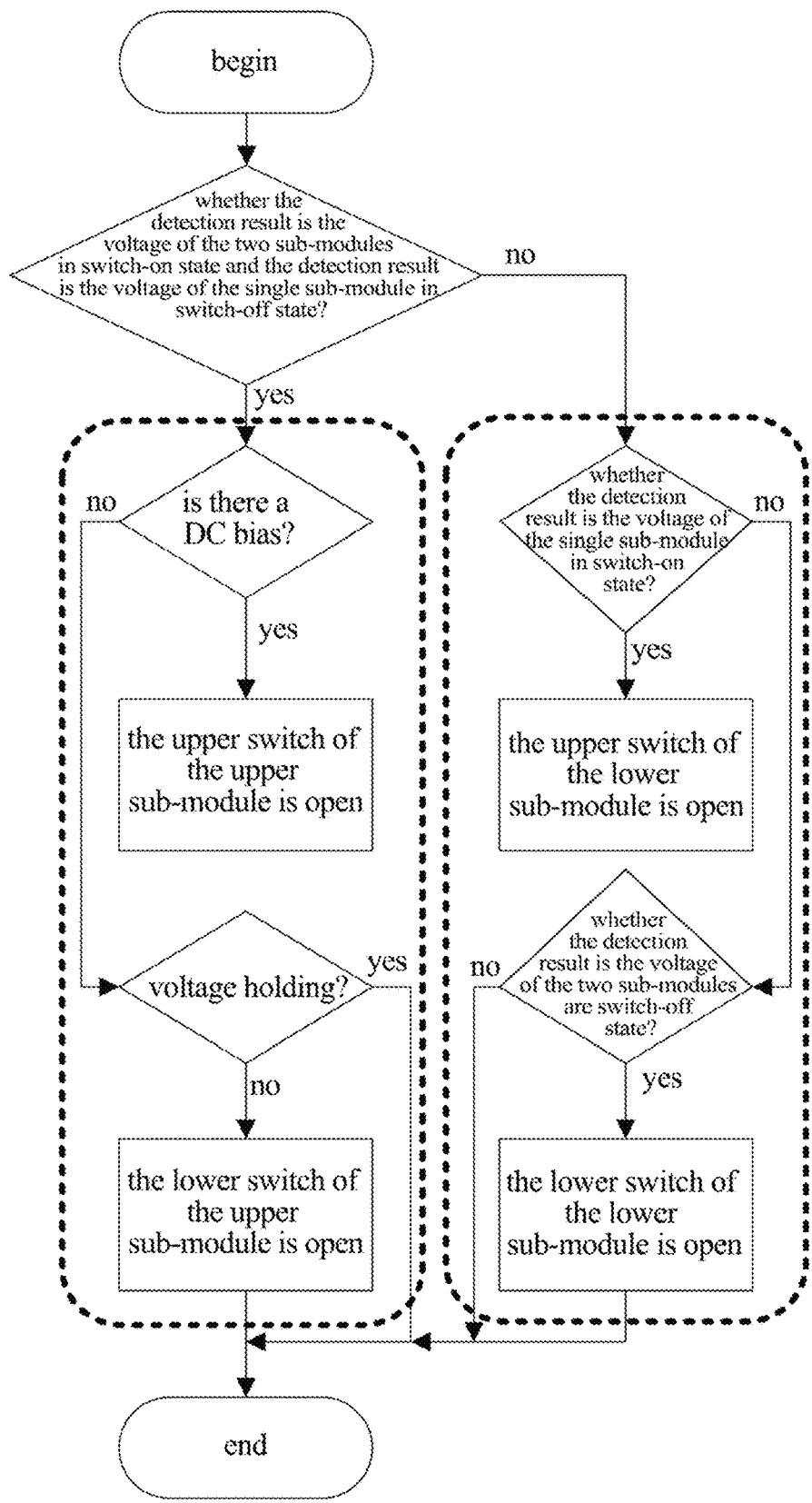
FIG. 16 is a flow diagram of the open-circuit fault diagnosis of the modular multilevel converter system shown in FIG. 1B.

FIG. 16 illustrates flows of open-circuit fault diagnosis of the modular multilevel converter system shown in FIGS. 1A and 1B. Positions of faults of the first and second sub-modules can be determined by judging voltage values in the switch-on state and the switch-off state.

When the first sub-module M1 and the second sub-module M2 are in the switch-on state, a detection result from the voltage detection unit is a sum of capacitor voltages of the two sub-modules M1-M2. When the first sub-module M1 and the second sub-module M2 are in the switch-off state, a detection result from the voltage detection unit is the capacitor voltage of the first sub-module M1. When the detected voltage of the first sub-module M1 has a DC bias, and the DC bias exceeds a first preset threshold, it can be determined that the open-circuit fault occurs on the upper switch S1 in the first sub-module M1.

When the first sub-module M1 and the second sub-module M2 are in the switch-on state, a detection result from the voltage detection unit is a sum of capacitor voltages of the two sub-modules M1 and M2. When the first sub-module M1 and the second sub-module M2 are in the switch-off state, a detection result from the voltage detection unit is the capacitor voltage of the first sub-module M1. When current flows from the output terminal of the first sub-module M1 to the output terminal of the second sub-module M2, and a sum of several voltage variations of the first sub-module M1 is greater than a second preset threshold, it can be determined that an open-circuit fault occurs on the lower switch S2 in the first sub-module M1. More specifically, after several voltage holding states, when a sum of voltage variations is greater than a certain threshold, for example, $\Delta U_1 + \Delta U_2 \ldots + \Delta U_n > U_{ref}$, it can be determined that the open-circuit fault occurs on the lower switch S2 in the first sub-module M1. In some embodiments, the second preset threshold can be set to 30% of a rated average voltage of the sub-modules, and when the second preset threshold is greater than 30% of the rated average voltage of the sub-modules, it can be considered that the open-circuit fault occurs on the second switch S2 in the first sub-module M1. The second preset threshold can be set according to actual needs, but the invention is not limited thereto.

When the first sub-module M1 and the second sub-module M2 are in the switch-on state, and a detection result from the voltage detection unit is the capacitor voltage of the first sub-module M1, it can be determined that an open-circuit fault occurs on the third switch S3 in the second sub-module M2.

When the first sub-module M1 and the second sub-module M2 are in the switch-on state, and a detection result from the voltage detection unit is a sum of capacitor voltages of the two sub-modules, it can be determined that an open-circuit fault occurs on the fourth switch S4 in the second sub-module M2.

In the invention, the judgment of open-circuit faults of the switches in the first sub-module M1 is shown in a left dotted box, and the judgment of open-circuit faults of the switches in the second sub-module M2 is shown in a right dotted box.

In the invention, when the sub-modules of the modular multilevel converter system are in H bridge structure, an open-circuit fault diagnosis method of the first bridge arms B11 and B21 (i.e., left bridge arms in FIG. 3) in the two sub-modules M1 and M2 of the H bridge structure is the same as the open-circuit fault diagnosis method with a half-bridge structure shown in FIG. 1B.

Figure 17A:
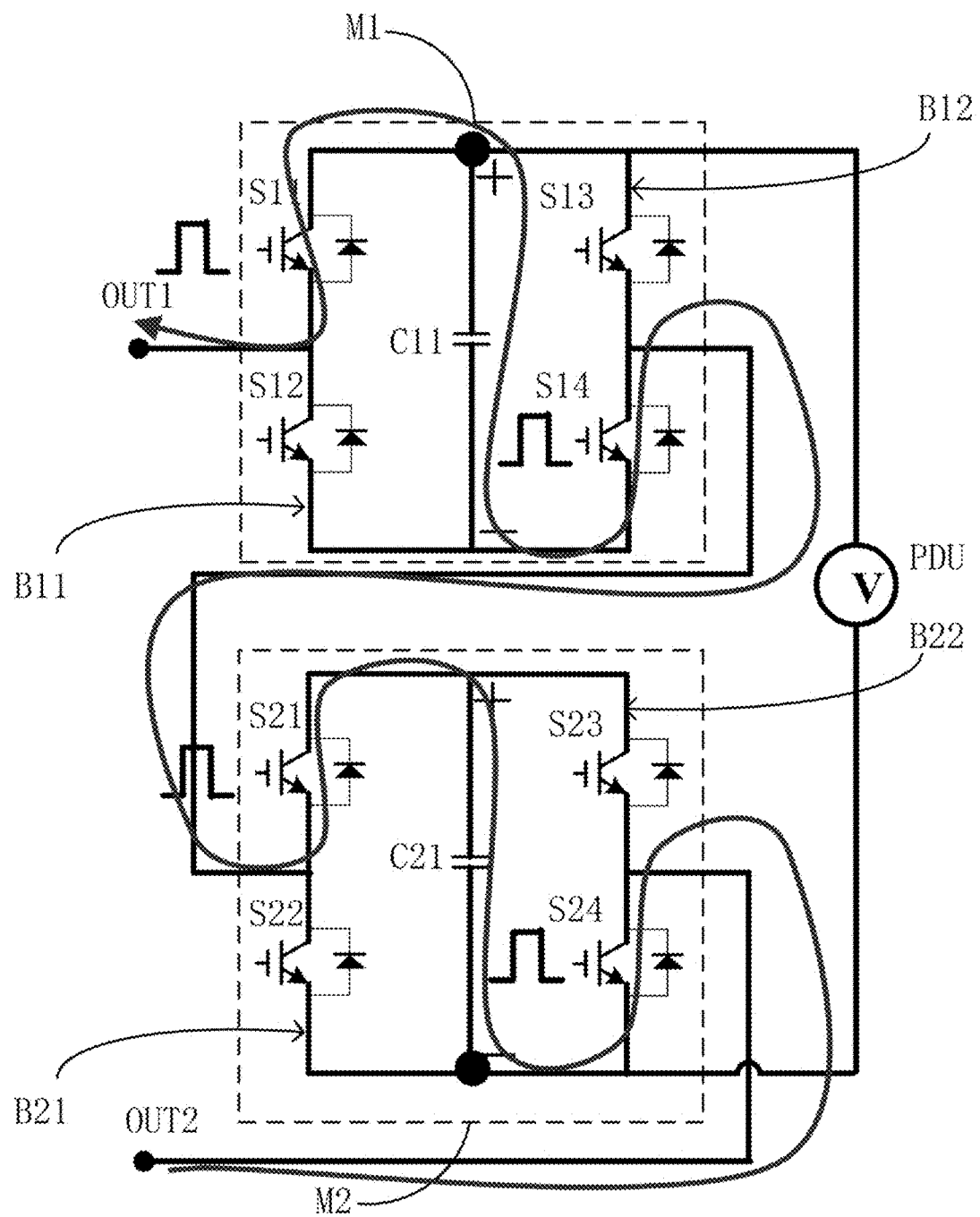
FIG. 17A illustrates a current flow direction and state when the two sub-modules in the modular multilevel converter system shown in FIG. 3 are in a switch-on state (the upper left switch and the lower right switch are turned on).
Figure 17B:
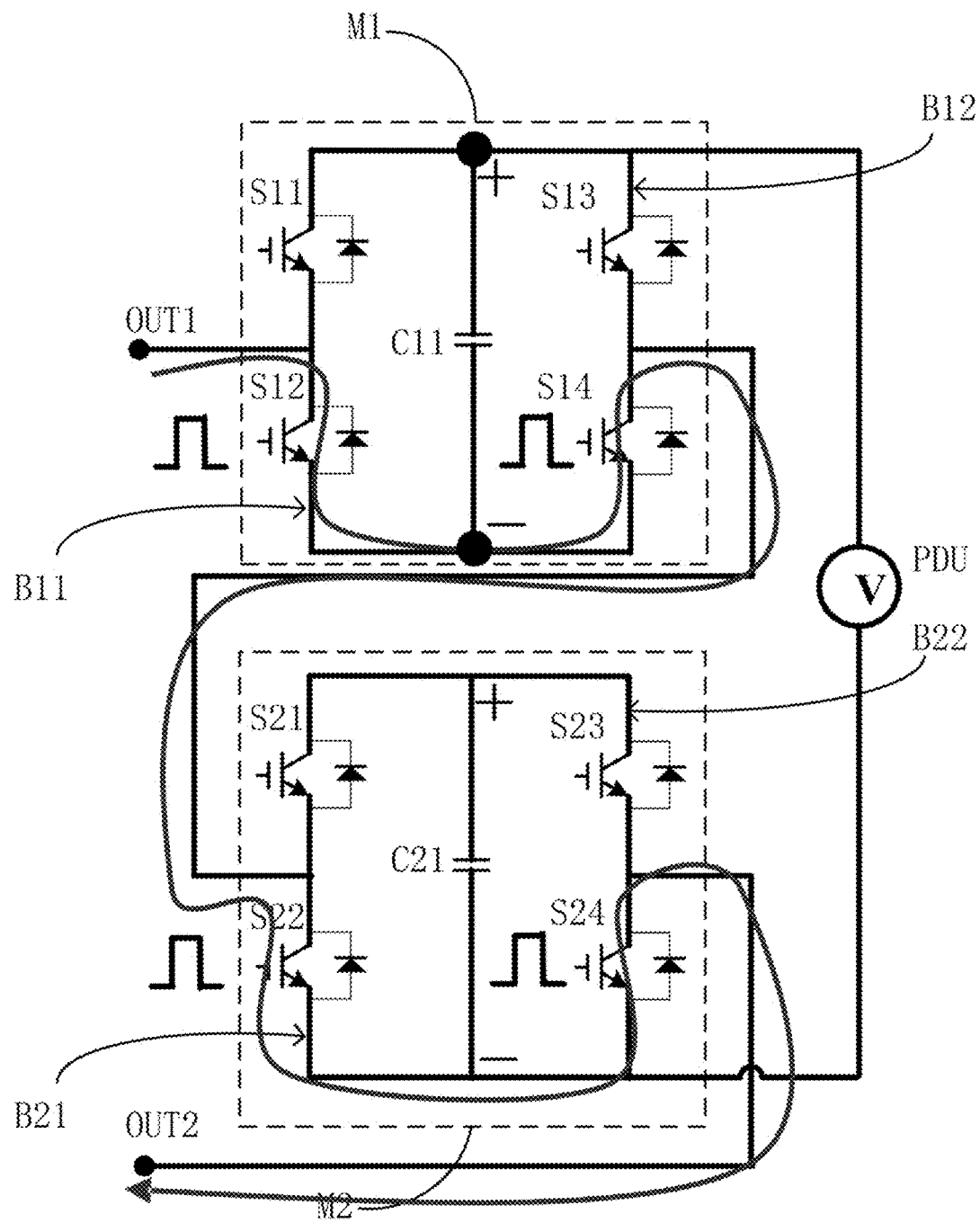
FIG. 17B illustrates a current flow direction and state when the two sub-modules in the modular multilevel converter system shown in FIG. 3 are in a switch-off state (the lower left switch and the lower right switch are turned on).

As shown in FIG. 17A, when the first sub-module M1 and the second sub-module M2 are in a switch-on state (i.e., the upper left switches S11, S21 and the lower right switches S14, S24 are turned on), a detection result from the voltage detection unit PDU is a sum of capacitor voltages of the two sub-modules M1 and M2. As shown in FIG. 17B, when the first sub-module M1 and the second sub-module M2 are in a switch-off state (i.e., the lower left switches S12, S22 and the lower right switches S14, S24 are turned on), a detection result from the voltage detection unit is capacitor voltage of the first sub-module M1.

Figure 18A:
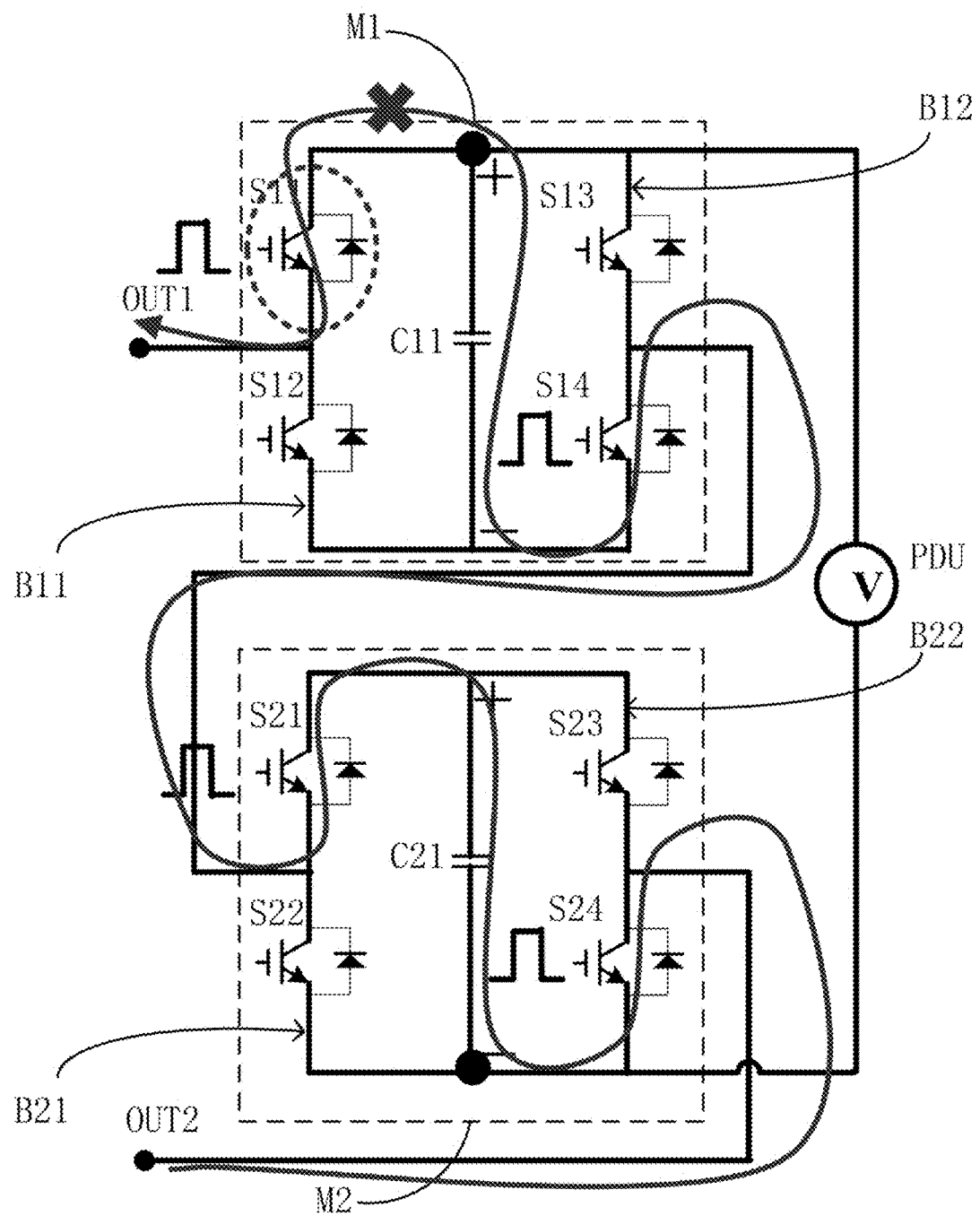
Figure 18B:
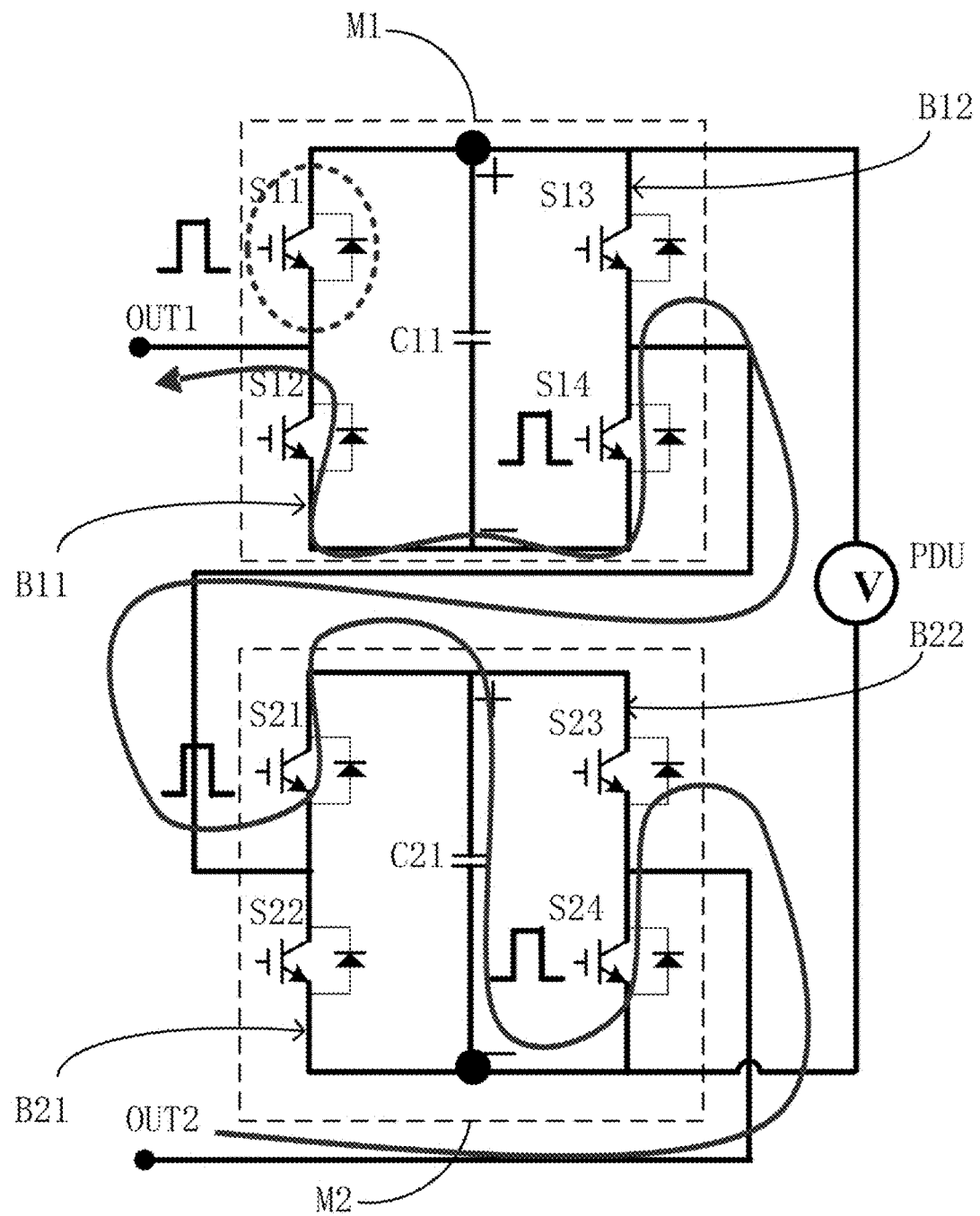
FIG. 18B illustrates a current flow direction when an open-circuit fault occurs on the upper left switch in the first sub-module in FIG. 18A.

FIG. 18A illustrates a current flow direction when the upper left switch S11 in the first sub-module M1 and the upper left switch S21 in the second sub-module M2 of the modular multilevel converter system shown in FIG. 3 are normally turned on, and FIG. 18B illustrates a current flow direction when an open-circuit fault occurs on the upper left switch S11 in the first sub-module M1 in FIG. 18A. When the upper left switch S11 in the first sub-module M1 is in open-circuit fault, the current cannot flow from the switch S11, and can only be forced to flow from an antiparallel diode of the lower left switch S12, as shown in FIG. 18B. Similarly, a discharge circuit for the capacitor C11 is cut off, and the capacitor C11 cannot be discharged, so a DC bias occurs.

Therefore, when the detected result has the DC bias, and the DC bias exceeds a first preset threshold, it can be determined that the open-circuit fault occurs on the first switch S11 (the upper left switch S11) in the first sub-module M1. In some embodiments, the first preset threshold can be set to 1.3 times a rated average voltage value of the sub-module. Of course, the first preset threshold can be set according to actual needs, but the invention is not limited thereto.

Figure 19A:
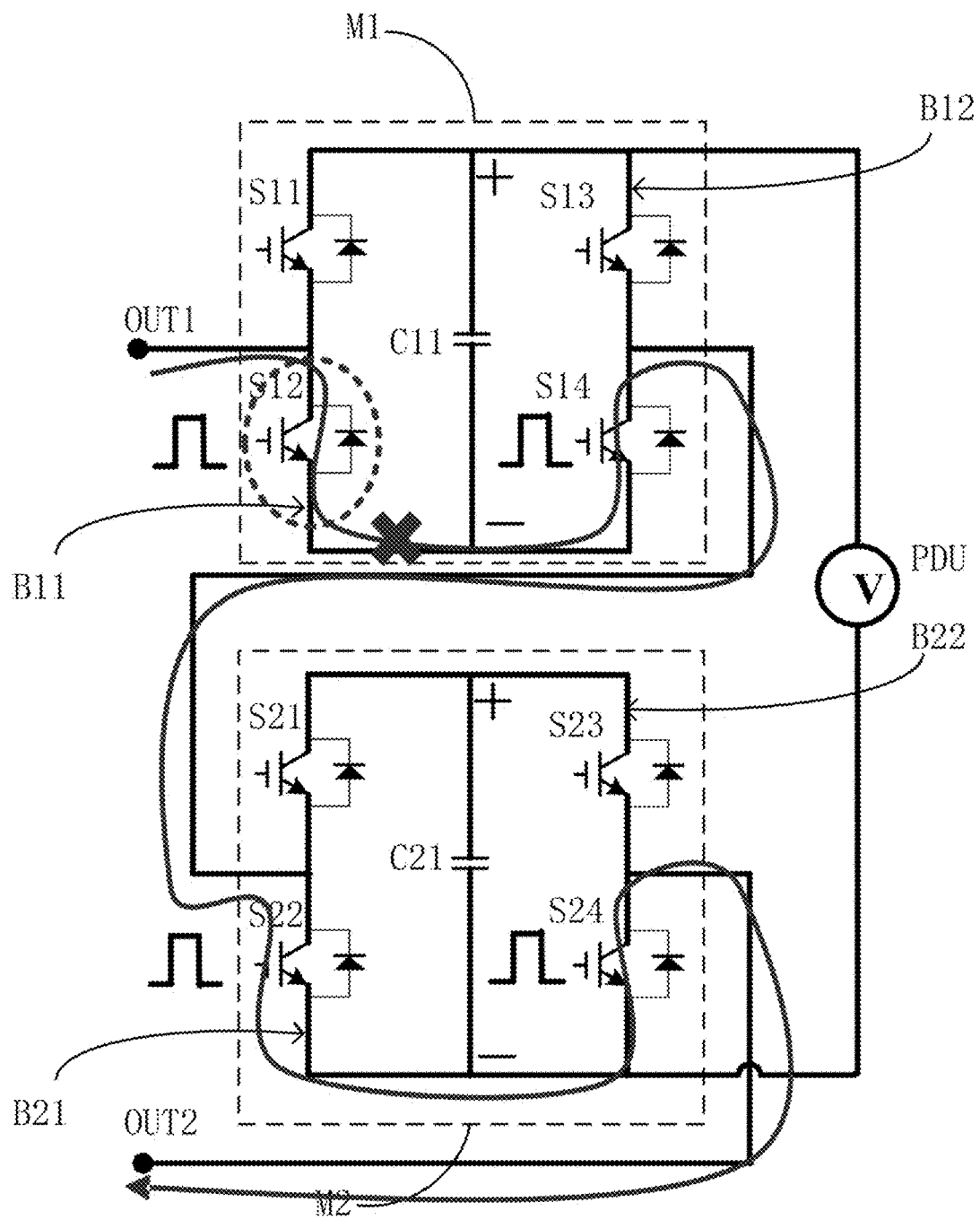
Figure 19B:
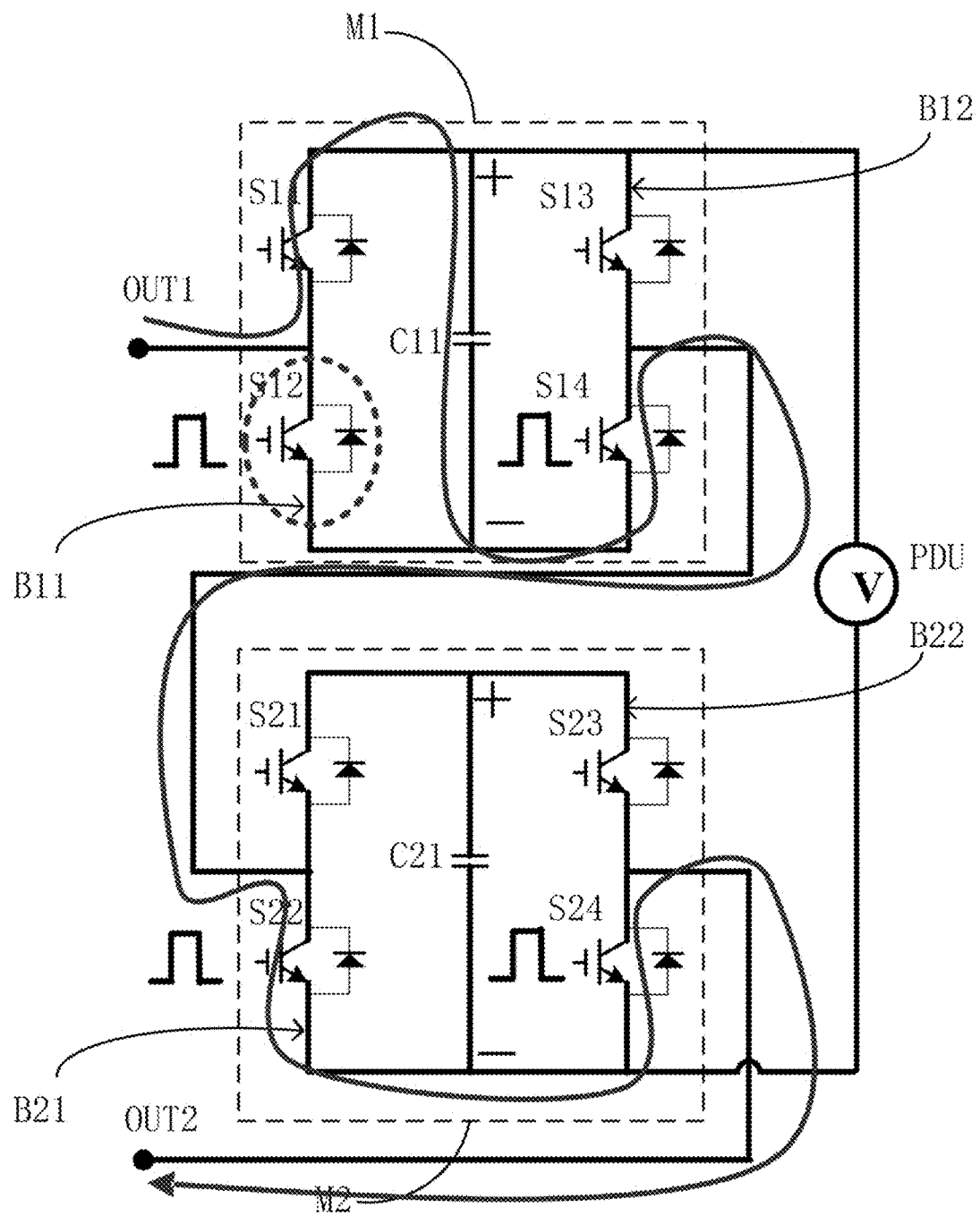
FIG. 19B illustrates a current flow direction when an open-circuit fault occurs on the lower left switch in the first sub-module.

FIG. 19A illustrates a current flow direction when the lower left switch S12 in the first sub-module M1 and the lower left switch S22 in the second sub-module M2 of the modular multilevel converter system shown in FIG. 3 are normally turned on, and FIG. 19B illustrates a current flow direction when an open-circuit fault occurs on the lower left switch S12 in the first sub-module M1 in FIG. 19A. When the lower left switch S12 in the first sub-module M1 is in open-circuit fault, the previous current path in FIG. 19A is cut off, and an antiparallel diode of the upper left switch S11 in the first sub-module M1 is conductive, and the capacitor C11 joins in the current loop, as shown in FIG. 19B, so a voltage holding state for the capacitor C11 is cut off to charge the capacitor C11, such that the capacitor voltage of the capacitor C11 continues to rise. As can be seen from FIGS. 19A and 19B, the open-circuit fault of the lower left switch S12 in the first sub-module M1 only influences the charging state of the capacitor C11, causing that the charging state is continued, and capacitor voltage cannot be maintained. Therefore, the characteristic of voltage holding during charge can serve as a judgment for open-circuit fault diagnosis of the lower switch S12. In some embodiments, after several voltage holding states, a sum of several voltage variations is greater than a second preset threshold, for example, $\Delta U1+\Delta U2 \ldots +\Delta Un>U_{ref}$, it can be determined that the open-circuit fault occurs on the lower left switch S12 in the first sub-module M1.

Therefore, when current flows from the output terminal of the first sub-module M1 to the output terminal of the second sub-module M2, and a sum of several voltage variations of the first sub-module M1 is greater than a second preset threshold, it can be determined that the open-circuit fault occurs on the lower left switch S12 in the first sub-module M1. In some embodiments, the second preset value can be set to 30% of a rated average voltage of the sub-modules, and when the second preset threshold is greater than 30% of the rated average voltage of the sub-modules, it can be considered that the open-circuit fault occurs on the lower switch S2 in the first sub-module M1. The second preset threshold can be set according to actual needs, but the invention is not limited thereto.

Figure 20A:
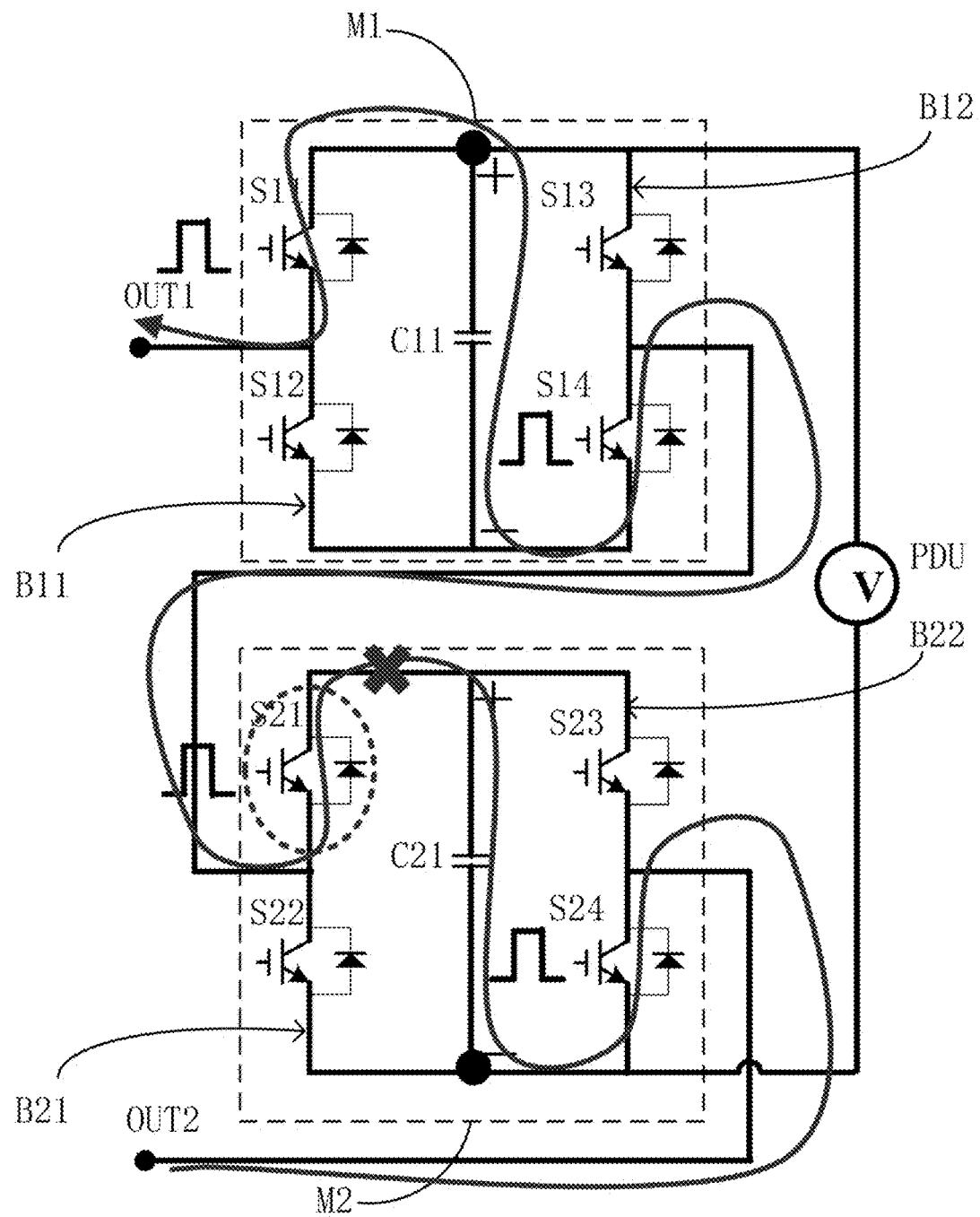
Figure 20B:
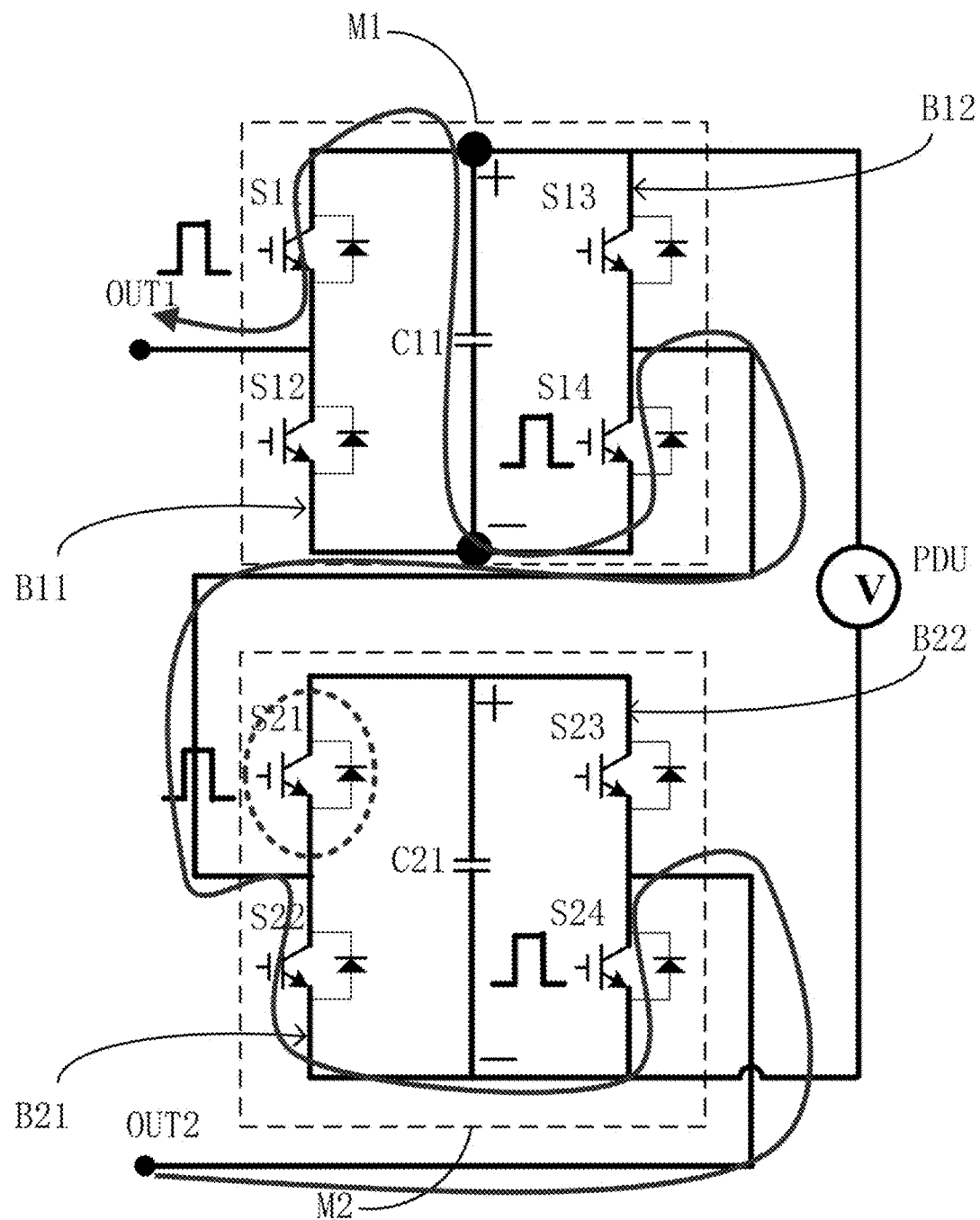
FIG. 20B illustrates a current flow direction when an open-circuit fault occurs on the upper left switch in the second sub-module in FIG. 20A.

FIG. 20A illustrates a current flow direction when the upper left switch S11 in the first sub-module M1 and the upper left switch S21 in the second sub-module M2 of the modular multilevel converter system shown in FIG. 3 are normally turned on, and FIG. 20B illustrates a current flow direction when an open-circuit fault occurs on the upper left switch S21 in the second sub-module M2 in FIG. 20A. During normal operation, the upper left switch S11 in the first sub-module M1 and the upper left switch S21 in the second sub-module M2 are turned on, i.e., the two sub-modules M1-M2 are in a switch-on state, and a detection result from the voltage detection unit PDU is a sum of capacitor voltages of the two sub-modules, as shown in FIG. 20A. However, when the upper left switch S21 in the second sub-module M2 is in open-circuit fault, the current is forced to flow from an antiparallel diode of the lower left switch S22 in the second sub-module M2, as shown in FIG. 20B, so when the sub-module is in the switch-on state, there may be a situation where only the capacitor voltage of the first sub-module M1 is measured, and the characteristic (i.e., the capacitor voltage of the first sub-module M1) can serve to diagnose the open-circuit fault of the upper left switch S21 in the second sub-module M2.

Therefore, when the first sub-module M1 and the second sub-module M2 are in the switch-on state, and a detection result from the voltage detection unit PDU is capacitor voltage of the first sub-module M1, it can be determined that an open-circuit fault occurs on the upper left switch S21 in the second sub-module M2.

Figure 21A:
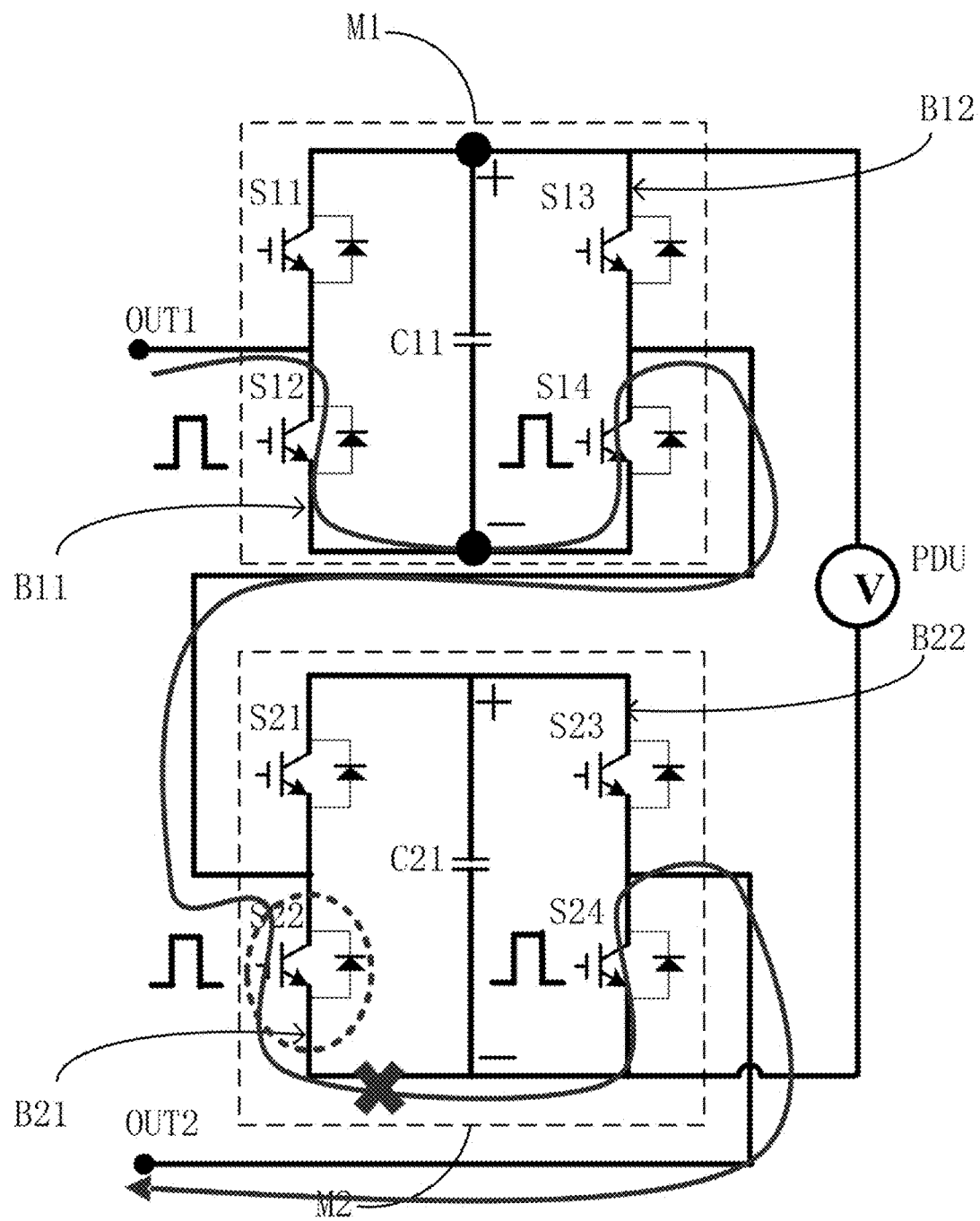
Figure 21B:
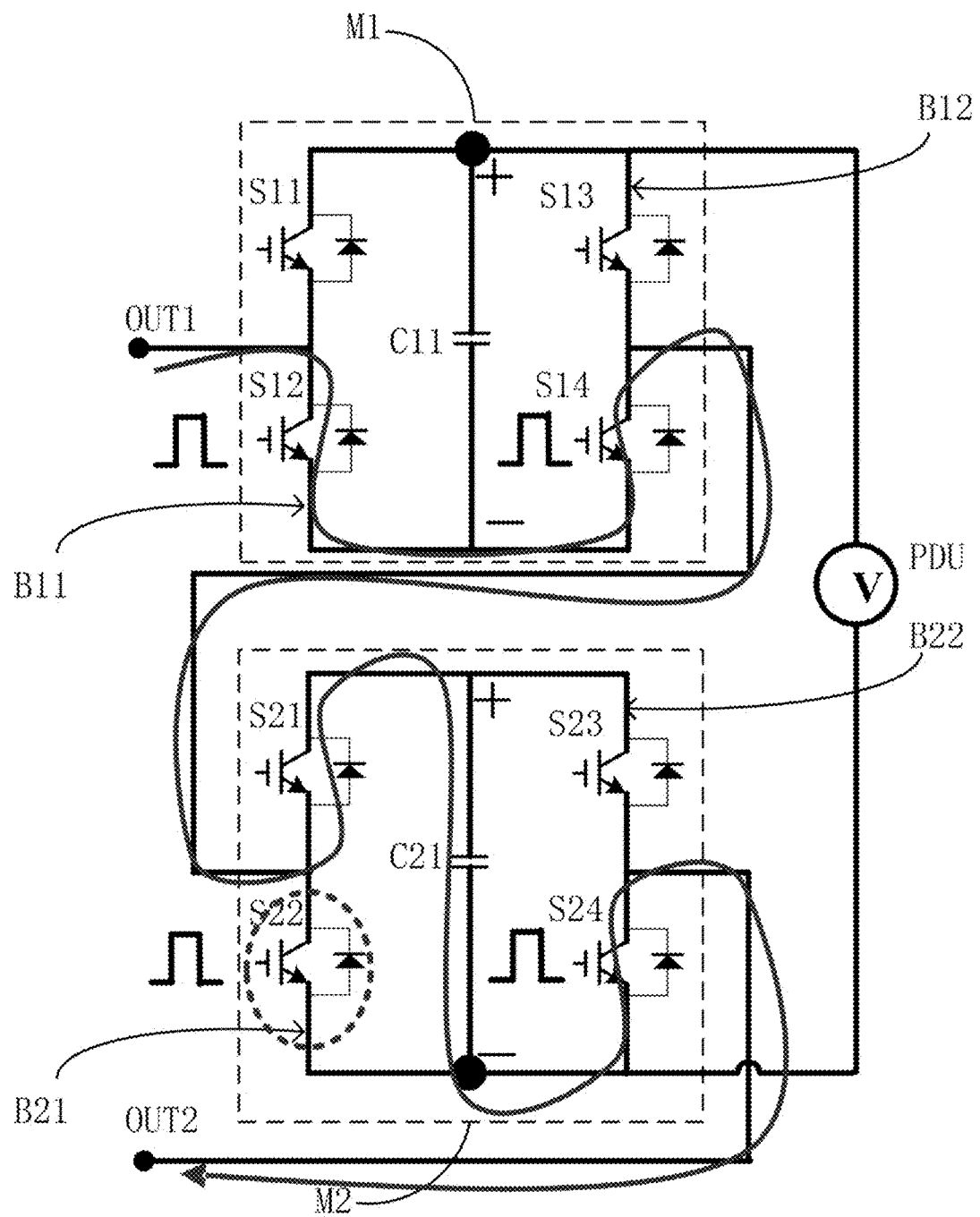
FIG. 21B illustrates a current flow direction when an open-circuit fault occurs on the lower left switch in the second sub-module in FIG. 21A.

FIG. 21A illustrates a current flow direction when the lower left switch S12 in the first sub-module M1 and the lower left switch S22 in the second sub-module M2 of the modular multilevel converter system shown in FIG. 3 are normally turned on, and FIG. 21B illustrates a current flow direction when an open-circuit fault occurs on the lower left switch S22 in the second sub-module M2 in FIG. 21A. During normal operation, the lower left switch S12 in the first sub-module M1 and the lower left switch S22 in the second sub-module M2 are turned on, i.e., the two sub-modules M1-M2 are in a switch-off state, and a detection result from the voltage detection unit PDU is capacitor voltage of the first sub-module M1, as shown in FIG. 21A. However, when the lower switch S4 of the second sub-module M2 is in open-circuit fault, the current is forced to flow from an antiparallel diode of the upper left switch S21 in the second sub-module M2, as shown in FIG. 21B, so when the sub-modules are in the switch-off state, there may be a situation where a sum of capacitor voltages of the two sub-modules M1 and M2 is measured, and the characteristic can serve to diagnose the open-circuit fault of the lower left switch S22 in the second sub-module M2.

Therefore, when the first sub-module M1 and the second sub-module M2 are in the switch-off state, and a detection result from the voltage detection unit PDU is a sum of capacitor voltages of the two sub-modules M1 and M2, it can be determined that the open-circuit fault occurs on the lower left switch S22 in the lower sub-module.

Figure 22A:
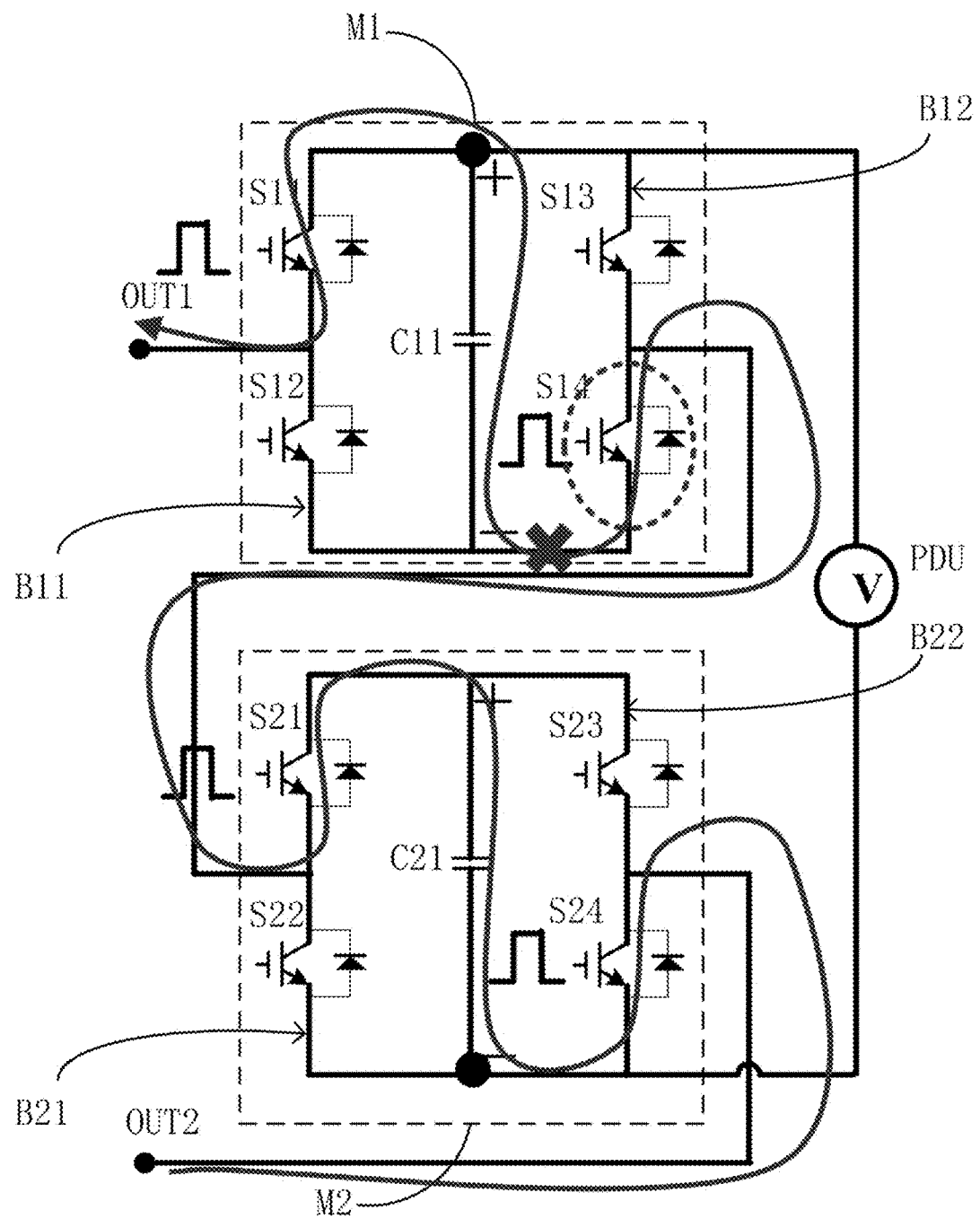
Figure 22B:
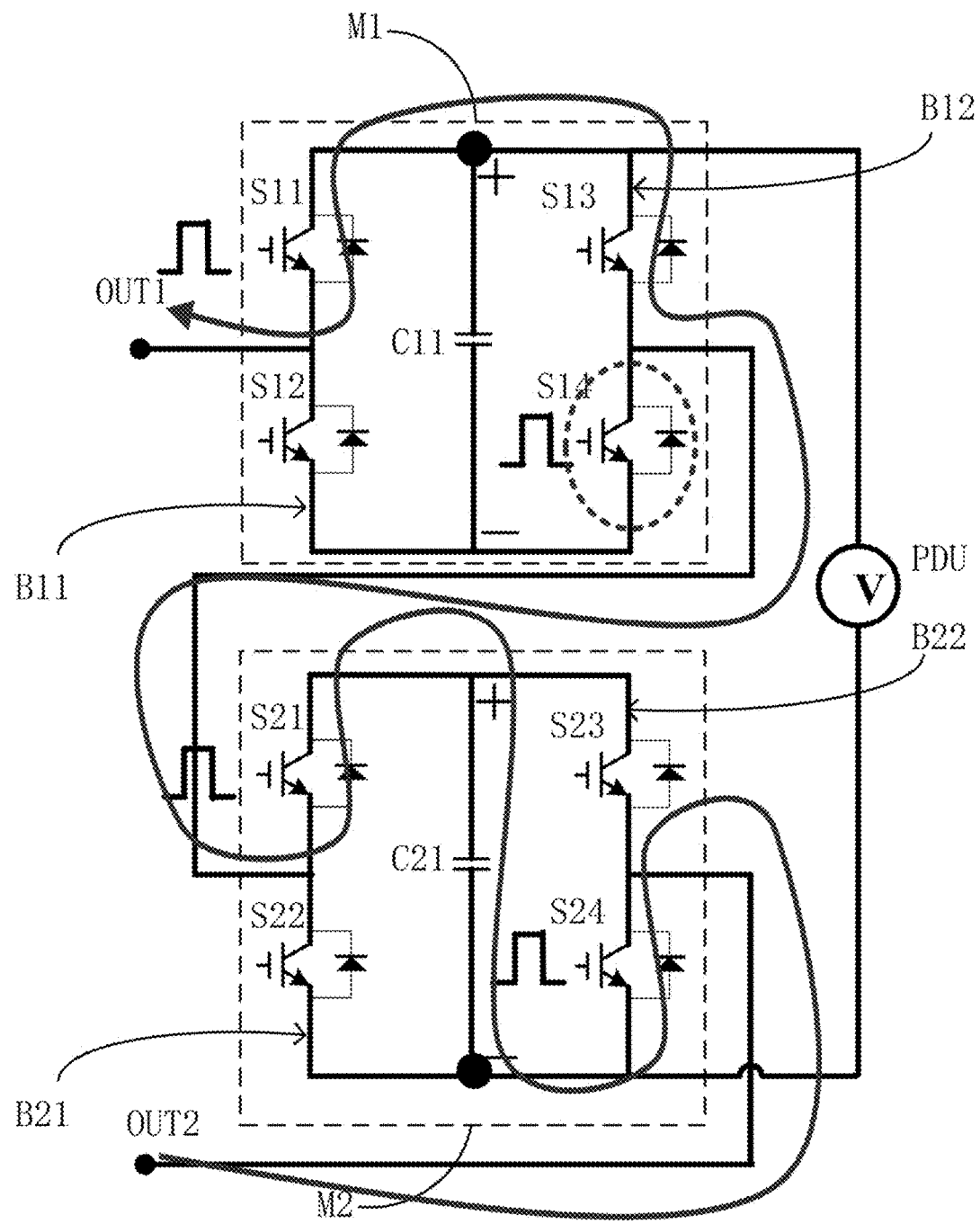
FIG. 22B illustrates a current flow direction when an open-circuit fault occurs on the lower right switch in the first sub-module in FIG. 22A.

FIG. 22A illustrates a current flow direction when the lower right switch S14 in the first sub-module M1 and the lower right switch S24 in the second sub-module M2 of the modular multilevel converter system shown in FIG. 3 are normally turned on, and FIG. 22B illustrates a current flow direction when an open-circuit fault occurs on the lower right switch S14 in the upper sub-module in FIG. 22A. When the first sub-module M1 and the second sub-module M2 are in a switch-on state, a detection result from the voltage detection unit PDU is a sum of capacitor voltages of the two sub-modules M1 and M2, as shown in FIG. 22A. However, when the lower right switch S14 in the first sub-module M1 is open, the current is forced to flow from an antiparallel diode of the upper right switch S13 in the first sub-module M1, as shown in FIG. 22B. When a DC bias is detected on the voltage of the first sub-module M1, and the DC bias exceeds a first preset threshold, and when current flows from the output terminal OUT2 of the second sub-module M2 to the output terminal OUT1 of the first sub-module M1, and a sum of several voltage variations of the first sub-module M1 is greater than a second preset threshold, it can be determined that the open-circuit fault occurs on the lower right switch S14 in the first sub-module M1. In other words, when the capacitor voltage of the first sub-module M1 has the DC bias, and a sum of several voltage variations is greater than the second preset threshold, it means that the lower right switch S14 in the first sub-module M1 is open.

Figure 23A:
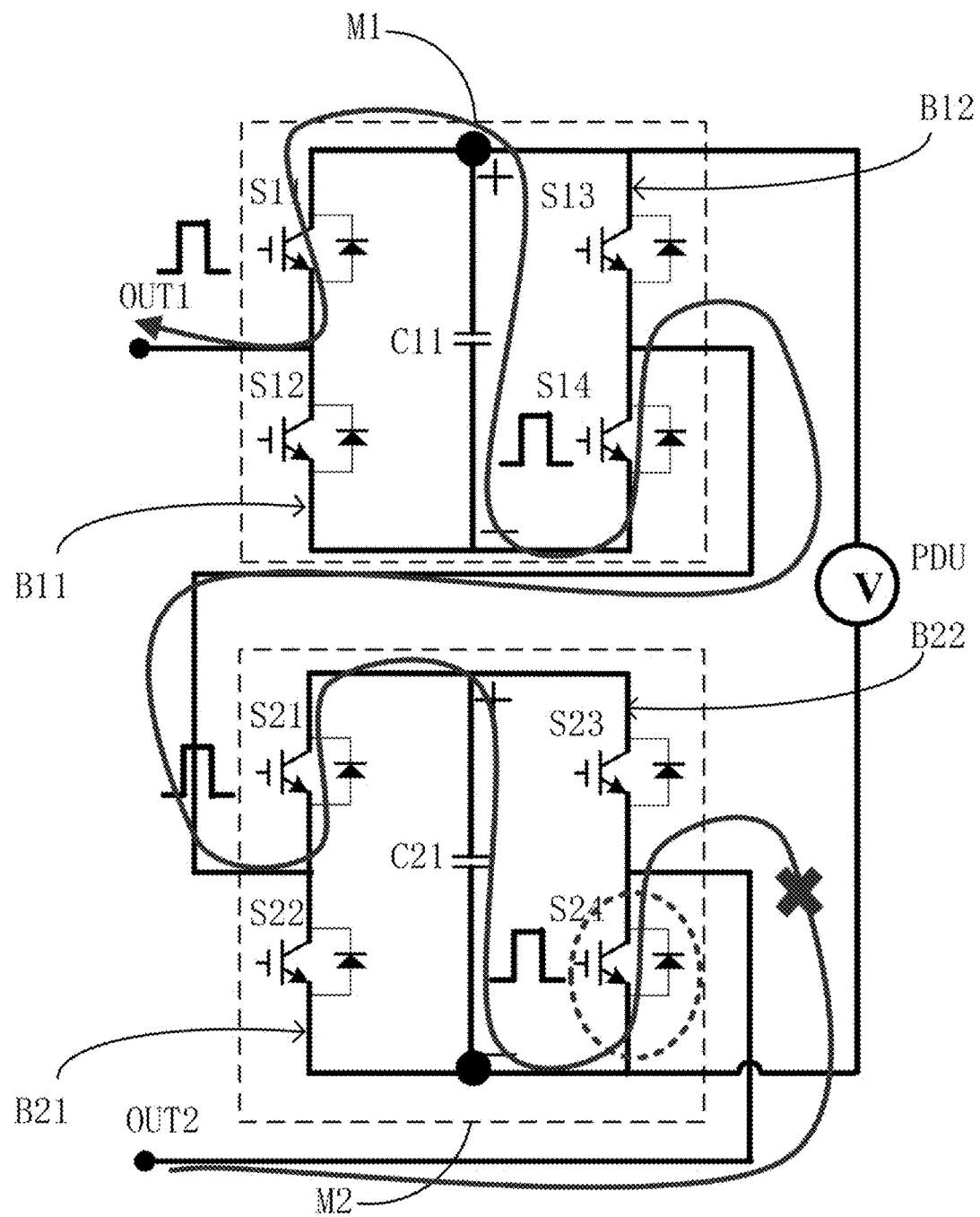
Figure 23B:
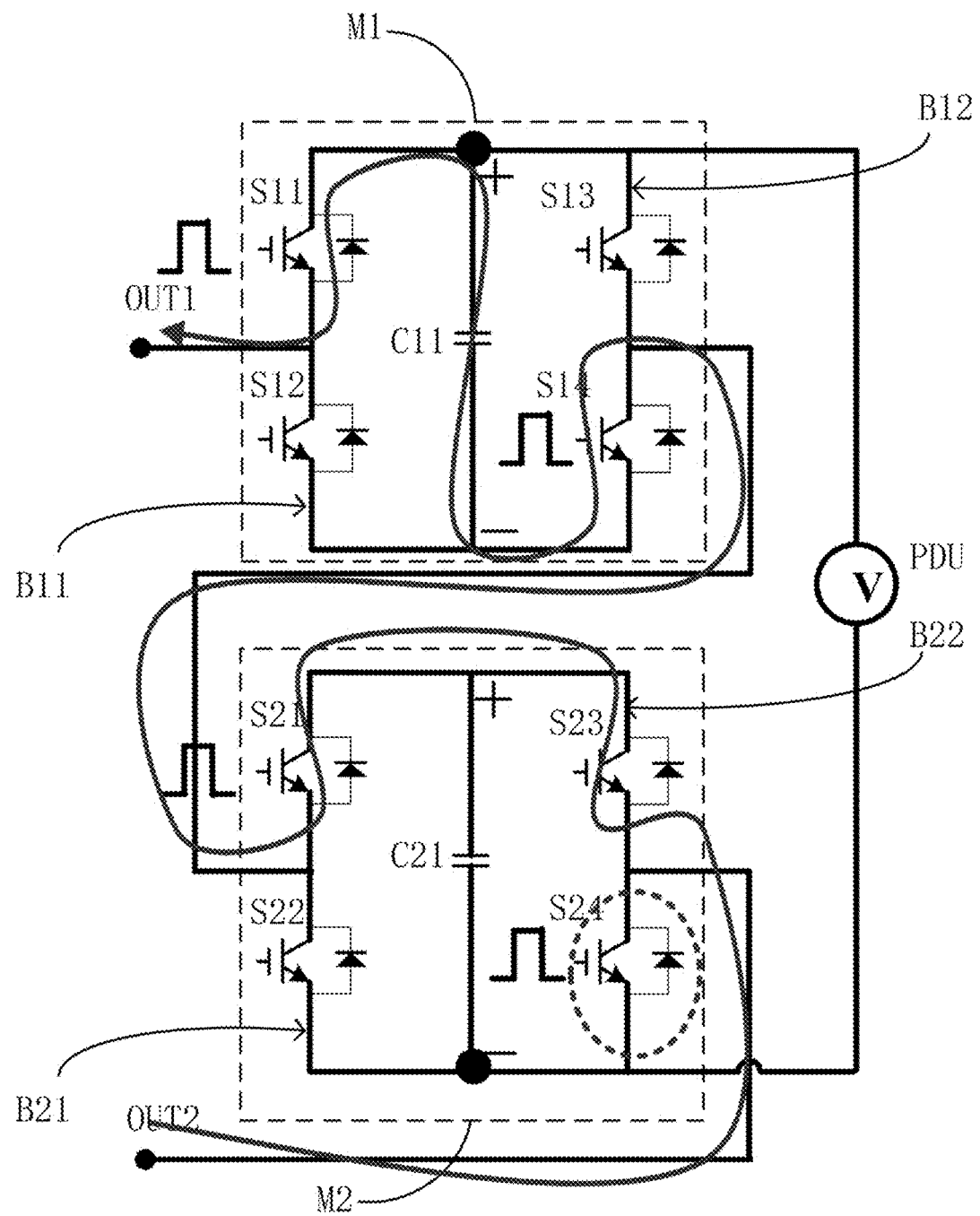
FIG. 23B illustrates a current flow direction when an open-circuit fault occurs on the lower right switch in the second sub-module in FIG. 23A.

FIG. 23A illustrates a current flow direction when the lower right switch S14 in the first sub-module M1 and the lower right switch S24 in the second sub-module M2 of the modular multilevel converter system shown in FIG. 3 are normally turned on, and FIG. 23B illustrates a current flow direction when an open-circuit fault occurs on the lower right switch S24 in the second sub-module M2 in FIG. 23A. When the first sub-module M1 and the second sub-module M2 are in a switch-on state, a detection result from the voltage detection unit PDU is a sum of capacitor voltages of the two sub-modules M1 and M2, as shown in FIG. 23A. However, when the lower right switch S24 in the second sub-module M2 is in open-circuit fault, the current is forced to flow from an antiparallel diode of the upper right switch S23 in the second sub-module M2, as shown in FIG. 23B.

When the voltage of the second sub-module M2 has a DC bias, and the DC bias exceeds a first preset threshold, and when current flows from the output terminal OUT2 of the second sub-module M2 to the output terminal OUT1 of the first sub-module M1, and a sum of several voltage variations of the second sub-module M2 is greater than a second preset threshold, it can be determined that an open-circuit fault occurs on the lower right switch S24 in the second sub-module M2. In other words, when the capacitor voltage of the second sub-module M2 has the DC bias, and a sum of several voltage variations is greater than the second preset threshold, it means that the lower right switch S24 in the second sub-module M2 is in open-circuit fault. The voltage of the second sub-module M2 can be estimated by a detection result from the voltage detection unit PDU, i.e., subtracting the capacitor voltage of the first sub-module M1 from the sum of capacitor voltages of the two sub-modules. It is judged whether the estimated voltage of the second sub-module M2 has the DC bias and whether the sum of several voltage variations is greater than the second preset threshold.

The invention can detect voltages of a plurality of sub-modules by using the voltage detection unit, such that the invention can spare a large number of detection units, reduce system cost and complexity, and improve system reliability.

The open-circuit fault diagnosis method of the invention can realize open-circuit fault diagnosis at a switch level and can avoid the non-detection zone in a bypass state.

The voltage detection circuit and the open-circuit fault diagnosis method of the invention are suitable for applying in medium and high voltage fields, can be applied to different sub-module topologies, and have a strong extendibility.

Exemplary embodiments of the invention have been shown and described above. It shall be understood that the invention is not limited to the disclosed embodiments. Instead, the invention intends to cover various modifications and equivalent settings included in the spirit and scope of the appended claims.

What is claimed is:

1. A modular multilevel converter system, comprising:
N sub-modules sequentially cascaded, where N is an integer greater than or equal to 2, each of the sub-modules comprising at least one bridge arm and a capacitor connected in parallel to the bridge arm, the capacitor having a positive terminal and a negative terminal; and
a voltage detection unit for detecting a voltage between at least two adjacent sub-modules in the N sub-modules, the voltage detection unit being connected in parallel between the positive terminal of the capacitor of the first sub-module and the negative terminal of the capacitor of the last sub-module in the at least two sub-modules.

2. The modular multilevel converter system according to claim 1, wherein the voltage detection unit is a voltage sensor.

3. The modular multilevel converter system according to claim 1, wherein the voltage detection unit detects the voltage between two adjacent sub-modules, the two sub-modules comprising a first sub-module and a second sub-module sequentially cascaded, wherein, during normal operation,
when the two sub-modules are in a switch-on state, a detection result from the voltage detection unit is a sum of capacitor voltages of the two sub-modules;
when the two sub-modules are in a switch-off state, a detection result from the voltage detection unit is a capacitor voltage of the first sub-module;
when the two sub-modules are in a blocked state and current flows from an output terminal of the first sub-module to an output terminal of the second sub-module, a detection result from the voltage detection unit is the sum of capacitor voltages of the two sub-modules;
when the two sub-modules are in the blocked state and current flows from the output terminal of the second sub-module to the output terminal of the first sub-module, a detection result from the voltage detection unit is the capacitor voltage of the first sub-module.

4. The modular multilevel converter system according to claim 3, wherein a capacitor voltage of the second sub-module is estimated by subtracting the capacitor voltage of the first sub-module from the sum of capacitor voltages of the two sub-modules.

5. A voltage detection method of a modular multilevel converter system, comprising:
configuring N sub-modules sequentially cascaded, where N is an integer greater than or equal to 2, each of the sub-modules comprising at least one bridge arm and a capacitor connected in parallel to the bridge arm, the capacitor having a positive terminal and a negative terminal; and
configuring a voltage detection unit for detecting a voltage between at least two adjacent sub-modules in the N sub-modules and connected in parallel between the positive terminal of the capacitor of the first sub-module and the negative terminal of the capacitor of the last sub-module in the at least two sub-modules.

6. The voltage detection method according to claim 5, wherein the voltage detection unit is a voltage sensor.

7. The voltage detection method according to claim 6, wherein the voltage detection unit detects the voltage between two adjacent sub-modules, the two sub-modules comprising a first sub-module and a second sub-module sequentially cascaded, wherein, during normal operation,
when the two sub-modules are in a switch-on state, a detection result from the voltage detection unit is a sum of capacitor voltages of the two sub-modules;
when the two sub-modules are in a switch-off state, a detection result from the voltage detection unit is a capacitor voltage of the first sub-module;
when the two sub-modules are in a blocked state and current flows from an output terminal of the first sub-module to an output terminal of the second sub-module, a detection result from the voltage detection unit is the sum of capacitor voltages of the two sub-modules;
when the two sub-modules are in the blocked state and current flows from the output terminal of the second sub-module to the output terminal of the first sub-module, a detection result from the voltage detection unit is the capacitor voltage of the first sub-module.

8. The voltage detection method according to claim 7, further comprising:
estimating a capacitor voltage of the second sub-module by subtracting the capacitor voltage of the first sub-module from the sum of capacitor voltages of the two sub-modules.

9. An open-circuit fault diagnosis method of a modular multilevel converter system, wherein the modular multilevel converter system comprises a plurality of sub-modules sequentially cascaded, each of the sub-modules comprising at least one bridge arm and a capacitor connected in parallel to the bridge arm, the capacitor having a positive terminal and a negative terminal, and a voltage detection unit for detecting a voltage between a first sub-module and a second sub-module connected adjacent in the plurality of sub-modules, the voltage detection unit being connected in parallel between the positive terminal of the capacitor of the first sub-module and the negative terminal of the capacitor of the second sub-module in the two sub-modules, comprising:

detecting the voltages between the two sub-modules in a switch-on state and a switch-off state by the voltage detection unit;

determining the sub-module with an open-circuit fault in the two sub-modules according to the detected result.

10. The open-circuit fault diagnosis method according to claim 9, wherein the sub-modules are in a half-bridge structure, the first sub-module comprises a first switch and a second switch connected in series, and the second sub-module comprises a third switch and a fourth switch connected in series.

11. The open-circuit fault diagnosis method according to claim 10, further comprising:

when the first sub-module and the second sub-module are in the switch-on state, a detection result from the voltage detection unit being a sum of capacitor voltages of the two sub-modules;

when the first sub-module and the second sub-module are in the switch-off state, a detection result from the voltage detection unit being a capacitor voltage of the first sub-module; and, when the detected capacitor voltage of the first sub-module has a DC bias and the DC bias exceeds a first preset threshold, determining that the open-circuit fault occurs on the first switch of the first sub-module.

12. The open-circuit fault diagnosis method according to claim 10, further comprising:

when the first sub-module and the second sub-module are in the switch-on state, a detection result from the voltage detection unit being a sum of capacitor voltages of the two sub-modules;

when the first sub-module and the second sub-module are in the switch-off state, a detection result from the voltage detection unit being a capacitor voltage of the first sub-module; and, when current flows from an output terminal of the first sub-module to an output terminal of the second sub-module and a sum of several voltage variations of the first sub-module is greater than a second preset threshold, determining that the open-circuit fault occurs on the second switch of the first sub-module.

13. The open-circuit fault diagnosis method according to claim 10, further comprising:

when the first sub-module and the second sub-module are in the switch-on state, if a detection result from the voltage detection unit is a capacitor voltage of the first sub-module, determining that the open-circuit fault occurs on the third switch of the second sub-module.

14. The open-circuit fault diagnosis method according to claim 10, further comprising:

when the first sub-module and the second sub-module are in the switch-off state, if a detection result from the voltage detection unit is a sum of capacitor voltages of the two sub-modules, determining that the open-circuit fault occurs on the fourth switch of the second sub-module.

15. The open-circuit fault diagnosis method according to claim 9, wherein each of the sub-modules is in an H bridge structure comprising a first bridge arm and a second bridge arm connected in parallel to the first bridge arm, wherein the first bridge arm comprises a first switch and a second switch connected in series, the second bridge arm comprises a third switch and a fourth switch connected in series; the capacitor is connected in parallel between the first bridge arm and the second bridge, when each of the sub-modules is in the switch-on state, the first switch and the fourth switch are turned on, and when each of the sub-modules is in the switch-off state, the second switch and the fourth switch are turned on.

16. The open-circuit fault diagnosis method according to claim 15, further comprising:

when the first sub-module and the second sub-module are in the switch-on state, a detection result from the voltage detection unit being a sum of capacitor voltages of the two sub-modules, when the first sub-module and the second sub-module are in the switch-off state, a detection result from the voltage detection unit being a capacitor voltage of the first sub-module, and when the detected capacitor voltage of the first sub-module has a DC bias and the DC bias exceeds a first preset threshold, determining that the open-circuit fault occurs on the first switch of the first sub-module.

17. The open-circuit fault diagnosis method according to claim 15, further comprising:

when the first sub-module and the second sub-module are in the switch-on state, a detection result from the voltage detection unit being a sum of capacitor voltages of the two sub-modules, when the first sub-module and the second sub-module are in the switch-off state, a detection result from the voltage detection unit being a capacitor voltage of the first sub-module, and when current flows from an output terminal of the first sub-module to an output terminal of the second sub-module and a sum of several voltage variations of the first sub-module is greater than a second preset threshold, determining that the open-circuit fault occurs on the second switch of the first sub-module.

18. The open-circuit fault diagnosis method according to claim 15, further comprising:

when the first sub-module and the second sub-module are in the switch-on state, a detection result from the voltage detection unit being a sum of capacitor voltages of the two sub-modules, when the first sub-module and the second sub-module are in the switch-off state, a detection result from the voltage detection unit being a capacitor voltage of the first sub-module, and when the detected capacitor voltage of the first sub-module has a DC bias exceeding a first preset threshold, and a sum of several voltage variations of the first sub-module is greater than a second preset threshold when current flows from an output terminal of the second sub-module to an output terminal of the first sub-module, determining that the open-circuit fault occurs on the fourth switch of the first sub-module.

19. The open-circuit fault diagnosis method according to claim 15, further comprising:

when the first sub-module and the second sub-module are in the switch-on state, if a detection result from the voltage detection unit is a capacitor voltage of the first sub-module, determining that the open-circuit fault occurs on the first switch of the second sub-module.

20. The open-circuit fault diagnosis method according to claim 15, further comprising:

when the first sub-module and the second sub-module are in the switch-off state, if a detection result from the voltage detection unit is a sum of capacitor voltages of the two sub-modules, determining that the open-circuit fault occurs on the second switch of the second sub-module.

21. The open-circuit fault diagnosis method according to claim 15, further comprising:

when the first sub-module and the second sub-module are in the switch-on state, a detection result from the voltage detection unit being a sum of capacitor voltages of the two sub-modules, when the first sub-module and the second sub-module are in the switch-off state, a detection result from the voltage detection unit being a capacitor voltage of the first sub-module, and when a capacitor voltage of the second sub-module has a DC bias exceeding a first preset threshold, and a sum of several voltage variations of the second sub-module is greater than a second preset threshold when current flows from an output terminal of the second sub-module to an output terminal of the first sub-module, determining that the open-circuit fault occurs on the fourth switch of the second sub-module.

\* \* \* \* \*